(12) United States Patent
Lin et al.

(10) Patent No.: US 11,211,203 B2
(45) Date of Patent: Dec. 28, 2021

(54) MANUFACTURING METHOD FOR CAPACITOR UNIT BY CUTTING

(71) Applicant: Powerchip Semiconductor Manufacturing Corporation, Hsinchu (TW)

(72) Inventors: Wei-Yu Lin, Hsinchu (TW); Shih-Hao Cheng, Hsinchu (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 103 days.

(21) Appl. No.: 16/518,927

(22) Filed: Jul. 22, 2019

(65) Prior Publication Data
US 2020/0143992 A1    May 7, 2020

(30) Foreign Application Priority Data
Nov. 5, 2018   (TW) .................. 107139186

(51) Int. Cl.
*H01G 4/30* (2006.01)
*H05K 1/18* (2006.01)
(Continued)

(52) U.S. Cl.
CPC .............. *H01G 4/306* (2013.01); *H01L 28/75* (2013.01); *H01L 28/91* (2013.01); *H01L 28/92* (2013.01); *H05K 1/181* (2013.01); *H05K 3/303* (2013.01); *H05K 2201/10015* (2013.01); *Y10T 29/43* (2015.01)

(58) Field of Classification Search
CPC ........ H01G 4/224; H01G 4/236; H01G 4/306; H01G 4/33; H01L 28/75; H01L 28/91; H01L 28/92; H05K 1/181; H05K 2201/10015; H05K 3/303; Y10T 29/43
See application file for complete search history.

(56) References Cited

U.S. PATENT DOCUMENTS

| | | | | |
|---|---|---|---|---|
| 2,389,420 A | * | 11/1945 | Deyrup .................... | H01G 4/30 427/79 |
| 3,617,834 A | * | 11/1971 | Rayburn .................. | H01G 4/30 361/321.2 |

(Continued)

FOREIGN PATENT DOCUMENTS

EP          0720213          7/1996

*Primary Examiner* — Minh N Trinh
(74) *Attorney, Agent, or Firm* — JCIPRNET

(57) ABSTRACT

A capacitor unit and a manufacturing method thereof are provided. The manufacturing method includes the following steps. An isolation layer is formed on a substrate. A first capacitor stacked structure and a second capacitor stacked structure are formed on the isolation layer. Electrode connectors are formed on the first capacitor stacked structure and the second capacitor stacked structure. The electrode connectors are exposed, so that the electrode connectors, the first capacitor stacked structure, the second capacitor stacked structure, the isolation layer, and the substrate are combined to form a capacitor integrated structure, wherein the isolation layer electrically isolates the substrate from the first capacitor stacked structure and the second capacitor stacked structure. The capacitor integrated structure is cut to form a first capacitor unit and a second capacitor unit separated from each other.

10 Claims, 50 Drawing Sheets

(51) Int. Cl.
*H01L 49/02* (2006.01)
*H05K 3/30* (2006.01)

(56) References Cited

U.S. PATENT DOCUMENTS

| | | | |
|---|---|---|---|
| 5,005,102 A | | 4/1991 | Larson |
| 5,406,447 A | | 4/1995 | Miyazaki |
| 5,923,077 A | * | 7/1999 | Chase ...................... H01G 4/40 |
| | | | 257/536 |
| 6,459,117 B1 | * | 10/2002 | Liou ....................... H01L 28/55 |
| | | | 257/306 |
| 6,516,504 B2 | * | 2/2003 | Schaper ................... H01G 4/35 |
| | | | 29/25.42 |
| 7,227,241 B2 | * | 6/2007 | Dirnecker ........... H01L 27/0805 |
| | | | 257/532 |
| 7,602,599 B1 | | 10/2009 | Hsu |
| 2020/0143992 A1 | * | 5/2020 | Lin ....................... H01G 4/306 |

* cited by examiner

MANUFACTURING METHOD FOR CAPACITOR UNIT BY CUTTING

CROSS-REFERENCE TO RELATED APPLICATION

This application claims the priority benefit of Taiwan application serial no. 107139186, filed on Nov. 5, 2018. The entirety of the above-mentioned patent application is hereby incorporated by reference herein and made a part of this specification.

BACKGROUND OF THE INVENTION

Field of the Invention

The invention relates to a method of manufacturing a capacitor unit and a structure thereof. The invention particularly relates to a method of manufacturing a capacitor unit and a structure thereof which can form a plurality of the capacitor units by cutting, and the capacitor units can function as capacitors.

Description of Related Art

The complete manufacturing process of existing capacitors (e.g., MLCC) includes many process steps, such as pulping, ceramic film molding, printing, stacking, evenly applying pressure, cutting, degumming, sintering, chamfering, silver coating, burning, electroplating, testing, packaging and other steps. The product manufacturing process is complex but very mature, the relevant industry chain suppliers or yield has long been a steady state of sufficient supply. Until the recent advancement of science and technology, the applications of various new fields of Internet of Things (IoT), 5G communication, blockchain, artificial intelligence (AI), and electric vehicles have been developed, and the functions of various types of electronic products have been increasing, so the types and quantities of required components have become increasingly large. The expansion of the number of the active components and the increase in precision have led to a multiplier of the number of passive components, and the multilayer ceramic capacitors (MLCCs) are the most. As a result, the market is gradually beginning to show a situation of short supply, and the recent increase in production of passive component suppliers cannot fully meet market demand. The shortage of goods will affect the development of the overall industry. On the other hand, how to layout all components within a limited space is a major issue. In order to meet the high-density component layout, it is imperative to reduce the component area or even the volume. Traditional capacitor manufacturing processes have faced challenges in terms of area miniaturization or product precision.

SUMMARY OF THE INVENTION

In view of this, the invention provides another choice for market supply by using a material, a structure, and a manufacturing process that is different from the conventional multilayer ceramic capacitors (MLCCs). The invention can also reduce the difficulty of area miniaturization, thereby improving the precision of the product. On the other hand, the high-temperature calcination process in the manufacturing process of the traditional multilayer ceramic capacitor (MLCC) can be avoided, thereby achieving energy saving and carbon reduction and reducing the manufacturing cost thereof. This is the technical problem to be solved by this invention.

In view of the above-mentioned disadvantages of the prior art, the invention provides a capacitor unit and a manufacturing method thereof, which provides an additional production capacity in the market while simultaneously solving the difficulty of miniaturization, simplifying the capacitor manufacturing process, and reducing the manufacturing cost.

To achieve the above and other related purposes, the invention provides a method of manufacturing a capacitor unit, including: providing a substrate; forming an isolation layer on the substrate; forming a first capacitor stacked structure and a second capacitor stacked structure on the isolation layer; forming electrode connectors on the first capacitor stacked structure and the second capacitor stacked structure, wherein the electrode connectors are exposed, so that the electrode connectors, the first capacitor stacked structure, the second capacitor stacked structure, the isolation layer, and the substrate are combined to form a capacitor integrated structure, wherein the isolation layer electrically isolates the substrate from the first capacitor stacked structure and the second capacitor stacked structure; and cutting the capacitor integrated structure to form a first capacitor unit and a second capacitor unit separated from each other, wherein the first capacitor unit includes two of the electrode connectors, the first capacitor stacked structure, a portion of the isolation layer, and a portion of the substrate, and the second capacitor unit includes another two of the electrode connectors, the second capacitor stacked structure, another portion of the isolation layer, and another portion of the substrate.

Preferably, in the above manufacturing method, the step of forming the first capacitor stacked structure and the second capacitor stacked structure includes: forming a first conductive layer on the isolation layer; forming a capacitor dielectric layer on the first conductive layer; forming a second conductive layer on the capacitor dielectric layer; lithographically etching the second conductive layer, the capacitor dielectric layer, and the first conductive layer thereunder in sequence to expose a first portion of the capacitor dielectric layer and a first portion of the isolation layer; forming an interlayer dielectric layer to cover the second conductive layer, the first portion of the capacitor dielectric layer, and the first portion of the isolation layer; lithographically etching the interlayer dielectric layer to form first via holes and second via holes, wherein each of the first via holes passes through the first portion of the capacitor dielectric layer to expose the first conductive layer under the first portion of the capacitor dielectric layer, and each of the second via holes exposes the second conductive layer; respectively filling the first via holes and the second via holes with a metal material to form first metal pillars and second metal pillars; and forming a first bonding pad over the first metal pillars, and forming a second bonding pad over the second metal pillars, wherein the first bonding pad is electrically connected to the first conductive layer by the first metal pillars to form a first electrode, and the second bonding pad is electrically connected to the second conductive layer by the second metal pillars to form a second electrode.

Preferably, in the above manufacturing method, the step of forming the first capacitor stacked structure and the second capacitor stacked structure includes: forming a first conductive layer on the isolation layer; lithographically etching the first conductive layer to expose a first portion of the isolation layer; forming two spacers connected to two sidewalls of the first conductive layer; forming a capacitor dielectric layer covering the first conductive layer and the first portion of the isolation layer, wherein the capacitor dielectric layer includes a third portion directly formed above the first portion of the isolation layer, and the capacitor dielectric layer and the sidewalls of the first conductive layer are isolated by the two spacers; forming a second conductive layer on a portion of the capacitor dielectric layer and exposing a fourth portion of the capacitor dielectric layer above the first conductive layer; forming an interlayer dielectric layer to cover the second conductive layer and the fourth portion of the capacitor dielectric layer; lithographically etching the interlayer dielectric layer to form first via holes and second via holes, wherein each of the first via holes passes through the fourth portion of the capacitor dielectric layer to expose the first conductive layer under the fourth portion, and each of the second via holes is disposed above the third portion of the capacitor dielectric layer to expose the second conductive layer above the third portion; respectively filling the first via holes and the second via holes with a metal material to form first metal pillars and second metal pillars; forming a bonding pad metal layer to respectively cover the interlayer dielectric layer, the first metal pillars, and the second metal pillars; and lithographically etching the bonding pad metal layer to form a first bonding pad over the first metal pillars and form a second bonding pad above the second metal pillars, wherein the first bonding pad is electrically connected to the first conductive layer by the first metal pillars to form a first electrode, and the second bonding pad is electrically connected to the second conductive layer by the second metal pillars to form a second electrode.

Preferably, in the above manufacturing method, the step of forming the first capacitor stacked structure and the second capacitor stacked structure includes: forming a first capacitor dielectric structure on the isolation layer, wherein the first capacitor dielectric structure includes a first conductive layer formed on the isolation layer and a first capacitor dielectric layer formed on the first conductive layer, the first conductive layer includes a first left electrode and a first right electrode isolated from each other, and the first capacitor dielectric layer includes first left openings formed above the first left electrode and first right openings formed above the first right electrode; forming at least one second capacitor dielectric structure on the first capacitor dielectric structure, wherein the second capacitor dielectric structure includes a second conductive layer formed on the first capacitor dielectric layer and a second capacitor dielectric layer formed on the second conductive layer, the second conductive layer includes a second left electrode and a second right electrode isolated from each other, the second left electrode is electrically connected to the first left electrode through the first left openings, the second right electrode is electrically connected to the first right electrode through the first right openings, the second capacitor dielectric layer includes second left openings formed above the second left electrode and second right openings formed above the second right electrode, the second left openings and the first left openings are offset from each other, and the second right openings and the first right openings are offset from each other; forming a third conductive layer on the second capacitor dielectric structure, wherein the third conductive layer includes a third left electrode and a third right electrode isolated from each other, the third left electrode is electrically connected to the second left electrode through the second left openings, and the third right electrode is electrically connected to the second right electrode through the second right openings; forming a third interlayer dielectric layer to cover the third conductive layer; lithographically etching the third interlayer dielectric layer to form first via holes and second via holes, wherein each of the first via holes exposes an upper surface of the third left electrode, and each of the second via holes exposes an upper surface of the third right electrode; respectively filling the first via holes and the second via holes with a metal material to form first metal pillars and second metal pillars; and forming a first bonding pad over the first metal pillars, and forming a second bonding pad over the second metal pillars, wherein the first bonding pad is electrically connected to the third left electrode by the first metal pillars, and the second bonding pad is electrically connected to the third right electrode by the second metal pillars.

Preferably, in the above manufacturing method, the step of forming the first capacitor dielectric structure includes: forming the first conductive layer on the isolation layer; forming a photoresist layer on the first conductive layer; performing a lithography process on the photoresist layer and then etching the first conductive layer to form a first trench, so that the first left electrode and the first right electrode isolated by the first trench are formed in the first conductive layer; removing the photoresist layer above the first left electrode and layer the first right electrode; filling the first trench with a first interlayer dielectric layer, and making an upper surface of the first interlayer dielectric layer flush with an upper surface of the first conductive layer; forming the first capacitor dielectric layer covering the first interlayer dielectric layer and the first conductive layer; and lithographically etching the first capacitor dielectric layer to form the first left openings exposing the first left electrode and the first right openings exposing the first right electrode.

Preferably, in the above manufacturing method, the step of forming the second capacitor dielectric structure includes: forming the second conductive layer on the first capacitor dielectric layer, wherein the first left openings and the first right openings are filled with the second conductive layer; lithographically etching the second conductive layer to form a second trench, so that the second left electrode and the second right electrode isolated by the second trench are formed in the second conductive layer, wherein the second trench is offset from the first trench, the second left electrode is electrically connected to the first left electrode through the first left openings, and the second right electrode is electrically connected to the first right electrode through the first right openings; forming a second interlayer dielectric layer on the second conductive layer, filling the second trench with the second interlayer dielectric layer, and making an upper surface of the second interlayer dielectric layer in the second trench flush with an upper surface of the second conductive layer; forming the second capacitor dielectric layer covering the second interlayer dielectric layer and the second conductive layer; and lithographically etching the second capacitor dielectric layer to form the second left openings exposing the second left electrode and the second right openings exposing the second right electrode, wherein the second left openings are offset from the first left openings, and the second right openings are offset from the first right openings.

Preferably, in the above manufacturing method, the method further includes: forming the third conductive layer on the second capacitor dielectric layer, wherein the second left openings and the second right openings are filled with the third conductive layer; etching the third conductive layer to form a third trench, so that the third left electrode and the third right electrode isolated by the third trench are formed in the third conductive layer, wherein the third trench is offset from the second trench, the third left electrode is electrically connected to the second left electrode through the second left openings, and the third right electrode is electrically connected to the second right electrode through the second right openings; and forming the third interlayer dielectric layer on the third conductive layer, wherein the third trench is filled with the third interlayer dielectric layer.

Preferably, in the above manufacturing method, the step of forming the first capacitor stacked structure and the second capacitor stacked structure includes: forming a first capacitor dielectric structure on the isolation layer, wherein the first capacitor dielectric structure includes a first conductive layer formed on the isolation layer and a first capacitor dielectric layer formed on the first conductive layer, the first conductive layer includes a first left electrode and a first right electrode isolated from each other, and the first capacitor dielectric layer includes first left openings formed above the first left electrode and first right openings formed above the first right electrode; forming a third conductive layer on the first capacitor dielectric structure, wherein the third conductive layer includes a third left electrode and a third right electrode isolated from each other, the third left electrode is electrically connected to the first left electrode through the first left openings, and the third right electrode is electrically connected to the first right electrode through the first right openings; forming a third interlayer dielectric layer to cover the third conductive layer; lithographically etching the third interlayer dielectric layer to form first via holes and second via holes, wherein each of the first via holes exposes an upper surface of a portion the third left electrode, and each of the second via holes exposes an upper surface of a portion of the third right electrode; respectively filling the first via holes and the second via holes with a metal material to form first metal pillars and second metal pillars; and forming a first bonding pad over the first metal pillars, and forming a second bonding pad over the second metal pillars, wherein the first bonding pad is electrically connected to the third left electrode by the first metal pillars, and the second bonding pad is electrically connected to the third right electrode by the second metal pillars.

Preferably, in the above manufacturing method, the step of respectively filling the first via holes and the second via holes with the metal material to form first metal pillars and second metal pillars includes: depositing the metal material on the interlayer dielectric layer, wherein the first via holes and the second via holes are filled with the metal material; and performing a planarization process to planarize an upper surface of the interlayer dielectric layer.

Preferably, in the above manufacturing method, the method further includes: forming a protection layer to respectively cover the first bonding pad, the second bonding pad, and the interlayer dielectric layer; and lithographically etching the protection layer to respectively form a first bonding pad opening exposing the first bonding pad and a second bonding pad opening exposing the second bonding pad.

Preferably, in the above manufacturing method, the first capacitor unit is a passive component connected to a printed circuit board by the two of the electrode connectors.

Preferably, in the above manufacturing method, the second capacitor unit is a passive component connected to a printed circuit board by the another two of the electrode connectors.

Furthermore, the invention further provides a capacitor unit formed by a capacitor integrated structure, wherein the capacitor integrated structure is cut to form capacitor units separated from each other, and each of the capacitor units comprises including: a substrate; an isolation layer located on the substrate; a capacitor stacked structure located on the isolation layer, wherein the isolation layer electrically isolates the substrate from the capacitor stacked structure; and two electrode connectors located on the capacitor stacked structure and being exposed.

Preferably, in the above capacitor unit, the capacitor stacked structure includes: a first conductive layer located on a portion of the isolation layer to expose a first portion of the isolation layer; a capacitor dielectric layer located on the first conductive layer; a second conductive layer located on a portion of the capacitor dielectric layer to expose a first portion of the capacitor dielectric layer; an interlayer dielectric layer located on the second conductive layer, the first portion of the capacitor dielectric layer, and the first portion of the isolation layer; a first bonding pad and a second bonding pad respectively located on the interlayer dielectric layer; and first metal pillars and second metal pillars, wherein the first metal pillars are located in the interlayer dielectric layer and pass through the first portion of the capacitor dielectric layer to connect to the first conductive layer under the first portion of the capacitor dielectric layer, so that the first conductive layer is electrically connected to the first bonding pad by the first metal pillars to form a first electrode, and the second metal pillars are located in the interlayer dielectric layer and connect to the second conductive layer, so that the second conductive layer is electrically connected to the second bonding pad by the second metal pillars to form a second electrode.

Preferably, in the above capacitor unit, the capacitor stacked structure includes: a first conductive layer located on the isolation layer and exposing a first portion of the isolation layer, wherein a spacer is formed on each of two sidewalls of the first conductive layer; a capacitor dielectric layer located on the first conductive layer and the first portion of the isolation layer, wherein the capacitor dielectric layer further includes a third portion directly located above the isolation layer, and the capacitor dielectric layer and each of the sidewalls of the first conductive layer are isolated by the spacer; a second conductive layer located on a portion of the capacitor dielectric layer and exposing a fourth portion of the capacitor dielectric layer above the first conductive layer; an interlayer dielectric layer located on the second conductive layer and the fourth portion of the capacitor dielectric layer; a first bonding pad and a second bonding pad respectively located on the interlayer dielectric layer; and first metal pillars and second metal pillars, wherein the first metal pillars are located in the interlayer dielectric layer and pass through the fourth portion of the capacitor dielectric layer to connect to the first conductive layer under the fourth portion of the capacitor dielectric layer, so that the first conductive layer is electrically connected to the first bonding pad by the first metal pillars to form a first electrode, and the second metal pillars are located in the interlayer dielectric layer and connect to the second conductive layer above the third portion of the capacitor dielectric layer, so that the second conductive layer is electrically connected to the second bonding pad by the second metal pillars to form a second electrode.

Preferably, in the above capacitor unit, the capacitor stacked structure includes: a first capacitor dielectric structure located on the isolation layer and having a first conductive layer located on the isolation layer and a first capacitor dielectric layer located on the first conductive layer, wherein the first conductive layer includes a first left electrode and a first right electrode isolated from each other, and the first capacitor dielectric layer includes first left openings formed above the first left electrode and first right openings formed above the first right electrode; at least one second capacitor dielectric structure located on the first capacitor dielectric structure, wherein the second capacitor dielectric structure includes a second conductive layer located on the first capacitor dielectric layer and a second capacitor dielectric layer located on the second conductive layer, the second conductive layer includes a second left electrode and a second right electrode isolated from each other, the second left electrode is electrically connected to the first left electrode through the first left openings, the second right electrode is electrically connected to the first right electrode through the first right openings, the second capacitor dielectric layer includes second left openings located above the second left electrode and second right openings located above the second right electrode, the second left openings and the first left openings are offset from each other, and the second right openings and the first right openings are offset from each other; a third conductive layer located on the second capacitor dielectric structure, wherein the third conductive layer includes a third left electrode and a third right electrode isolated from each other, the third left electrode is electrically connected to the second left electrode through the second left openings, and the third right electrode is electrically connected to the second right electrode through the second right openings; a third interlayer dielectric layer located on the third conductive layer; a first bonding pad and a second bonding pad respectively located on the third interlayer dielectric layer; and first metal pillars and second metal pillars respectively formed in the third interlayer dielectric layer, wherein the third left electrode is electrically connected to the first bonding pad by the first metal pillars, and the third right electrode is electrically connected to the second bonding pad by the second metal pillars.

Preferably, in the above capacitor unit, the capacitor stacked structure includes: a first capacitor dielectric structure located on the isolation layer and having a first conductive layer located on the isolation layer and a first capacitor dielectric layer located on the first conductive layer, wherein the first conductive layer includes a first left electrode and a first right electrode isolated from each other, and the first capacitor dielectric layer includes first left openings formed above the first left electrode and first right openings formed above the first right electrode; a third conductive layer located on the first capacitor dielectric structure, wherein the third conductive layer includes a third left electrode and a third right electrode isolated from each other, the third left electrode is electrically connected to the first left electrode through the first left openings, and the third right electrode is electrically connected to the first right electrode through the first right openings; a third interlayer dielectric layer located on the third conductive layer; a first bonding pad and a second bonding pad respectively located on the third interlayer dielectric layer; and first metal pillars and second metal pillars respectively formed in the third interlayer dielectric layer, wherein the third left electrode is electrically connected to the first bonding pad by the first metal pillars, and the third right electrode is electrically connected to the second bonding pad by the second metal pillars.

Preferably, the above capacitor unit further includes: a protection layer respectively covering the first bonding pad and the second bonding pad; a first bonding pad opening formed in the protective layer to expose the first electrode; and a second bonding pad opening formed on the second bonding pad to expose the second electrode.

Preferably, in the above capacitor unit, each of the capacitor units is a passive component connected to a printed circuit board by the two electrode connectors.

Based on the above description, the invention forms the capacitor stacked structures on the substrate by the isolation layer to form the capacitor integrated structure including the capacitor units. Therefore, the capacitor integrated structure can be cut to form a plurality of the capacitor units that can function as capacitors. Compared with the manufacturing process of the traditional MLCC, the invention can simplify the capacitor manufacturing process and the capacitor structure and can avoid the high-temperature calcination process in the manufacturing process of the traditional MLCC, so as to achieve the purpose of reducing the manufacturing cost.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2-1 to FIG. 2-16 are schematic views illustrating embodiments of the capacitor unit at different manufacture stages according to a second embodiment of the invention.

FIG. 3-1 to FIG. 3-20 are schematic views illustrating embodiments of the capacitor unit at different manufacture stages according to a third embodiment of the invention.

DESCRIPTION OF THE EMBODIMENTS

The method of manufacturing the capacitor unit of the invention mainly includes the following steps. A substrate is provided. An isolation layer is formed on the substrate by, for example, a deposition method. A first capacitor stacked structure and a second capacitor stacked structure are formed on the isolation layer, wherein the substrate is electrically isolated from the first capacitor stacked structure and the second capacitor stacked structure, and the first capacitor stacked structure, the second capacitor stacked structure, the isolation layer, and the substrate are combined to form a capacitor integrated structure. In the embodiments as shown in FIG. 4A, FIG. 4B, FIG. 5A, and FIG. 5B, the first capacitor stacked structure 12A and the second capacitor stacked structure 12B are distributed in an array form on the isolation layer 11 of the substrate 10 to form the capacitor integrated structure 1.

Figure 4A:
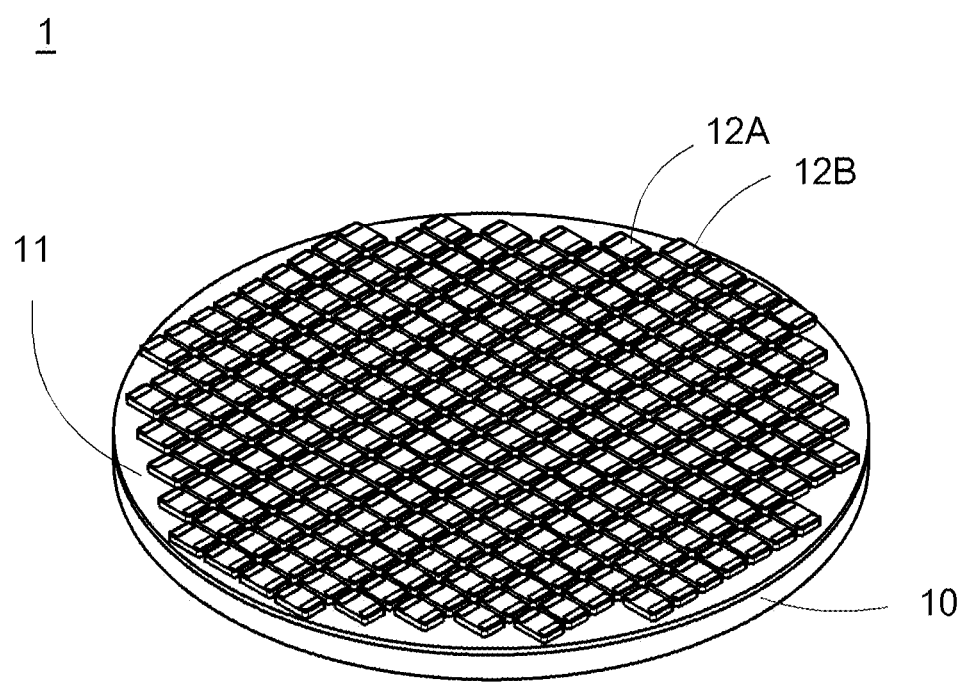
FIG. 4A, FIG. 4B, and FIG. 4C are schematic views illustrating a first embodiment of the capacitor unit of the invention.
Figure 4B:
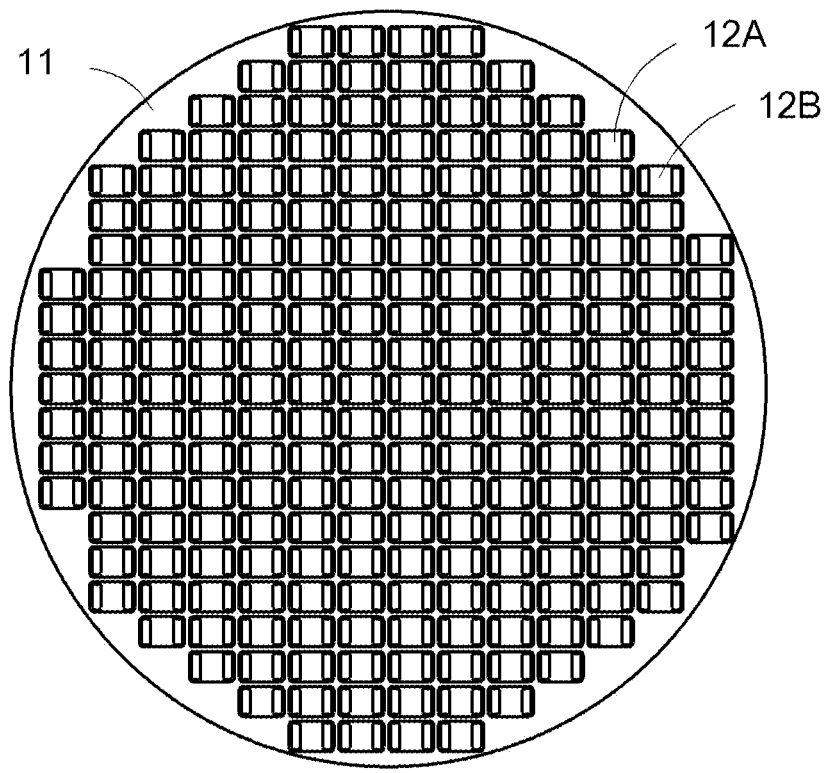
Figure 4C:
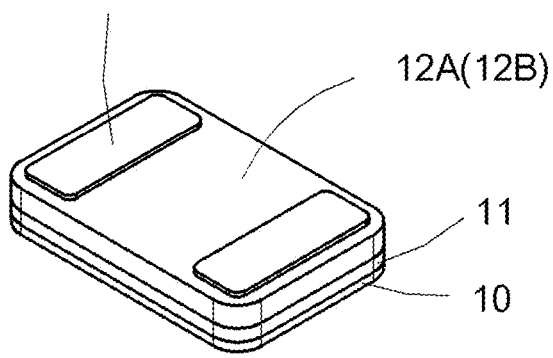
Figure 5A:
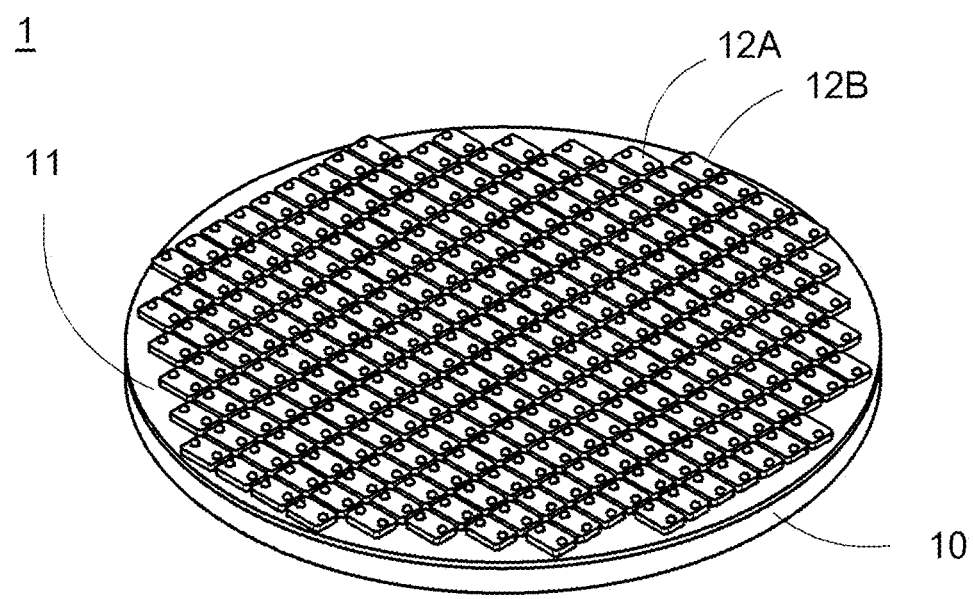
FIG. 5A, FIG. 5B, and FIG. 5C are schematic views illustrating a second embodiment of the capacitor unit of the invention.
Figure 5B:
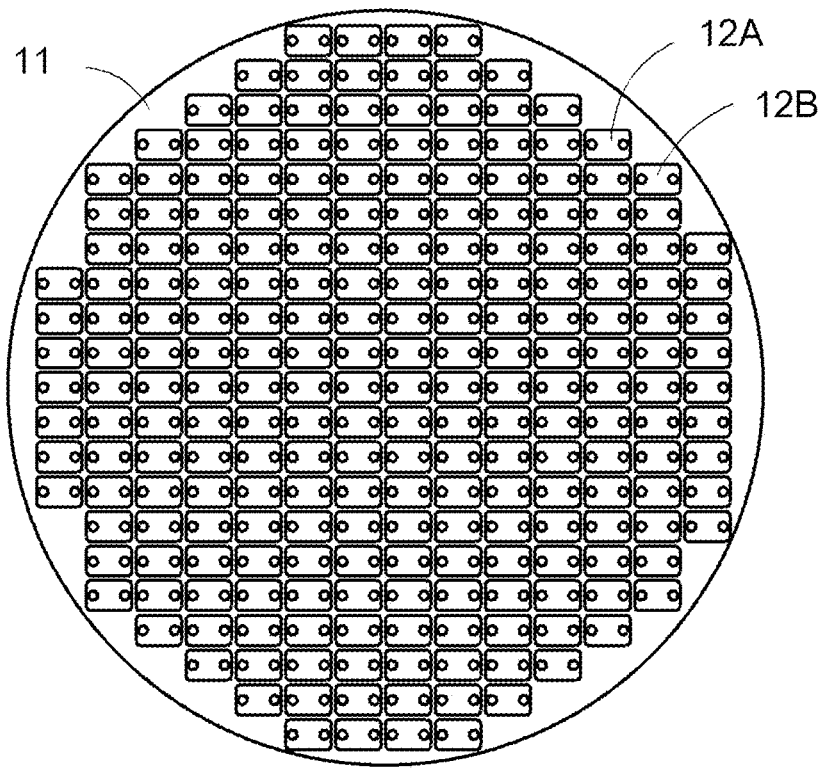
Figure 5C:
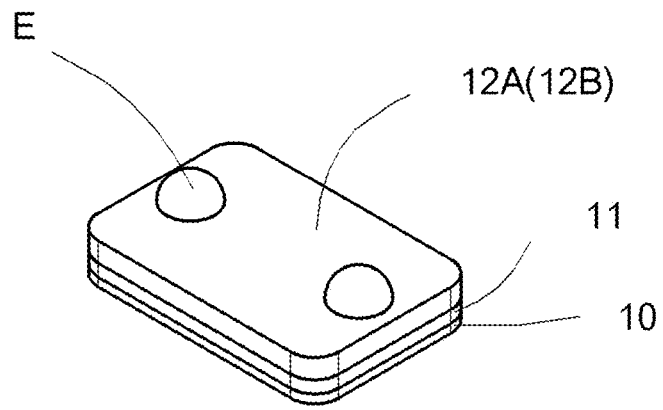

Then, the capacitor integrated structure 1 is cut to form the first capacitor unit 100A and the second capacitor unit 100B separated from each other, and the first capacitor unit 100A and the second capacitor unit 100B can be used as capacitors. Therefore, the capacitor manufacturing process can be simplified, and the capacitor can be mass-produced by using the existing semiconductor equipment for substrate. The first capacitor unit 100A includes two electrode connectors E, the first capacitor stacked structure 12A, a portion of the isolation layer 11, and a portion of the substrate 10. The second capacitor unit 100B includes another two electrode connectors E, the second capacitor stacked structure 12B, another portion of the isolation layer 11, and another portion of the substrate 10. The electrode connectors E are formed on the first capacitor stacked structure 12A and the second capacitor stacked structure 12B, and the electrode connectors E are exposed. The first capacitor unit 100A is a passive component connected to a printed circuit board by the electrode connectors E. The second capacitor unit 100B is a passive component connected to a printed circuit board by the electrode connectors E. In the embodiments as shown in FIG. 4C and FIG. 5C, the electrode connectors E of the first capacitor unit 100A and the second capacitor unit 100B can be designed as a rectangular cube or a semi-spherical sphere according to actual needs. One of the two electrode connectors E of first capacitor unit 100A (or second capacitor unit 100B) may be electrically connected to the first bonding pad (e.g., the first bonding pad 127A in FIG. 1-10, the first bonding pad 227A in FIG. 2-16, or the first bonding pad 327A in FIG. 3-20) of the first capacitor stacked structure 12A (or the second capacitor stacked structure 12B). The other one of the two electrode connectors E of first capacitor unit 100A (or second capacitor unit 100B) may be electrically connected to the second bonding pad (e.g., the second bonding pad 127B in FIG. 1-10, the second bonding pad 227B in FIG. 2-16, or the second bonding pad 327B in FIG. 3-20) of the second capacitor stacked structure 12A (or the second capacitor stacked structure 12B). The electrode connectors E may be formed by the method (e.g., bumping process) well known in the art and will not be described herein.

Regarding the manufacture of the capacitor unit of the invention, the following embodiments are provided for explanation.

First Embodiment

Referring to FIG. 1-1 to FIG. 1-10, FIG. 1-1 to FIG. 1-10 are schematic views illustrating a series of embodiments of the capacitor unit at different manufacture stages according to a first embodiment of the invention.

Figure 1:
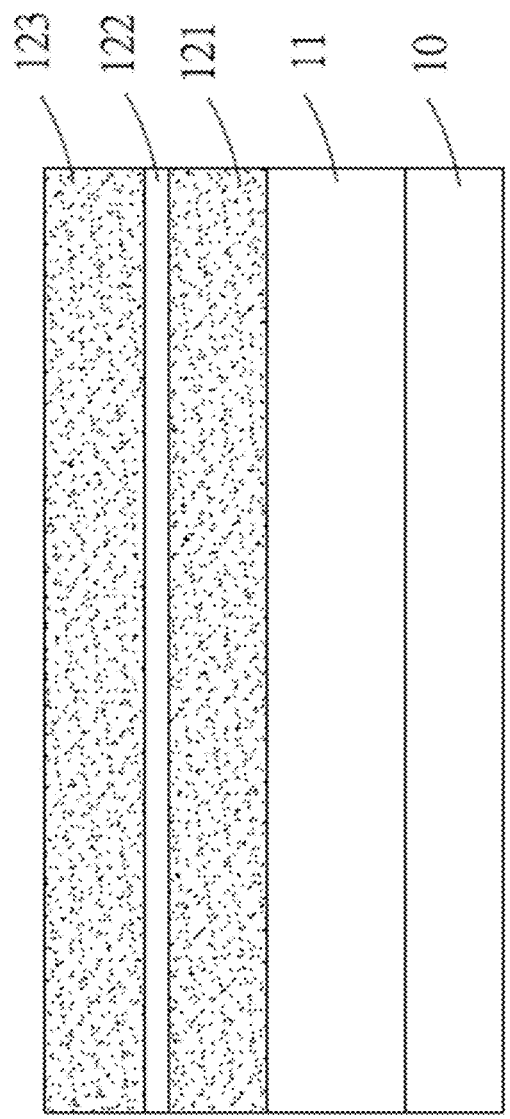
FIG. 1-1 to FIG. 1-10 are schematic views illustrating embodiments of the capacitor unit at different manufacture stages according to a first embodiment of the invention.

As shown in FIG. 1-1, the substrate 10 (e.g., a wafer) is provided on which the isolation layer 11 is formed. In the present embodiment, the isolation layer 11 is, for example, an underlying insulating layer deposited on the substrate 10 by a chemical vapor deposition (CVD) process or an oxidation process, and the substrate 10 may be a carrier used to produce an integrated circuit. In one embodiment, the substrate 10 may be, for example, a silicon substrate, but not limited thereto. The substrate 10 may be other types of substrates such as a glass substrate or a quartz substrate.

As shown in FIG. 1-1, in sequence, the first conductive layer 121 is formed on the isolation layer 11, the capacitor dielectric layer 122 is formed on the first conductive layer 121, and the second conductive layer 123 is formed on the capacitor dielectric layer 122. In the present embodiment, the first conductive layer 121 and the second conductive layer 123 may be metal layers formed by sputtering, electroplating, or evaporation, but not limited thereto. The first conductive layer 121 and the second conductive layer 123 may also be a non-metal layer formed by chemical vapor deposition. The capacitor dielectric layer 122 may be formed, for example, by deposition. For example, in addition to metal, the conductive layer material of the first conductive layer 121 and the second conductive layer 123 may include a non-metal (e.g., a doped polysilicon, a doped single crystal silicon, or a doped amorphous silicon) or a metal silicide.

Figures 1, 2:
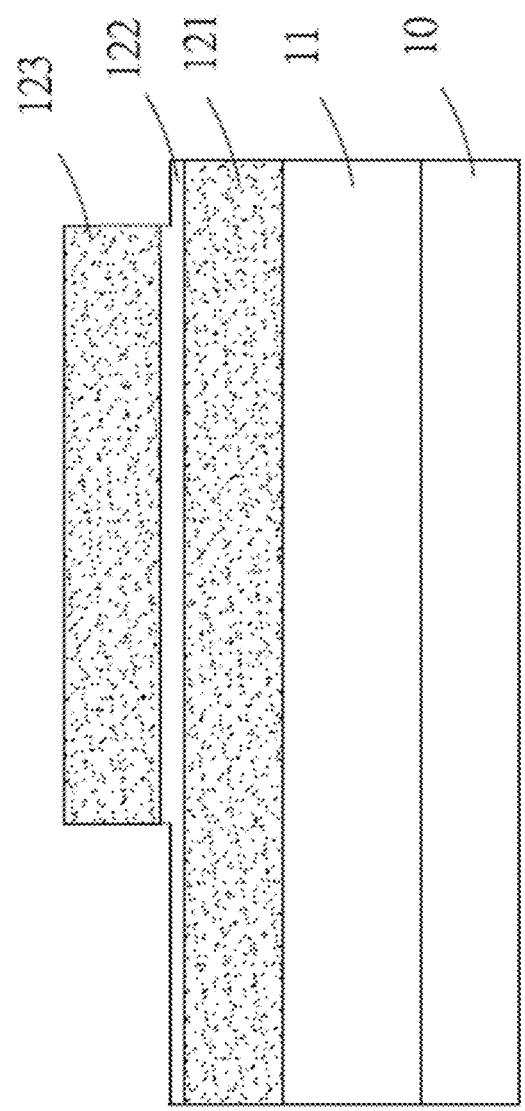
Figures 1, 2, 3:
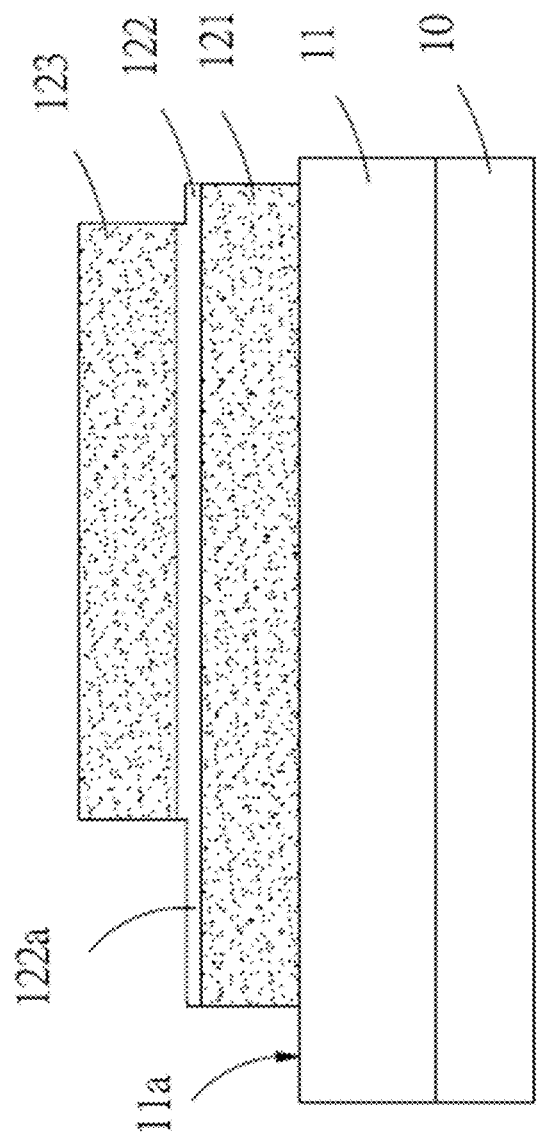

As shown in FIG. 1-2, a portion of the second conductive layer 123 is lithographically etched to expose a portion of the capacitor dielectric layer 122. Next, as shown in FIG. 1-3, a portion of the exposed portion of the capacitor dielectric layer 122 and the first conductive layer 121 thereunder are lithographically etched to expose a portion of the isolation layer 11. In the present embodiment, the first portion 122a of the capacitor dielectric layer 122 and the first portion 11a of the isolation layer 11 are exposed.

As shown in FIG. 1-4, the interlayer dielectric layer 124 is formed to cover the second conductive layer 123, the exposed first portion 122a of the capacitor dielectric layer 122, and the exposed first portion 11a of the isolation layer 11. In the present embodiment, the interlayer dielectric layer 124 is formed, for example, by deposition. Then, a chemical mechanical polishing (CMP) process or an etch back process is performed to planarize the upper surface of the interlayer dielectric layer 124, and a lithography and etching process is performed to form the first via holes 125A and the second via holes 125B in the interlayer dielectric layer 124. Each of the first via holes 125A passes through the first portion 122a of the capacitor dielectric layer 122 to expose the first conductive layer 121 under the first portion 122a of the capacitor dielectric layer 122, and each of the second via holes 125B exposes the second conductive layer 123.

As shown in FIG. 1-5, for example, a chemical vapor deposition (CVD) process is performed to form a metal material 126 over the interlayer dielectric layer 124, and the first via holes 125A and the second via holes 125B are filled with the metal material 126.

As shown in FIG. 1-6, for example, a chemical mechanical polishing (CMP) process or an etch back process is performed to remove the metal material 126 on the upper surface of the dielectric layer 124 and remove the metal material 126 outside the first via holes 125A and the second via holes 125B, thereby forming the first metal pillars 126A and the second metal pillars 126B in the first via holes 125A and the second via holes 125B. As a result of performing the planarization process described above, the upper surface of the interlayer dielectric layer 124 is flush with the upper surfaces of the first metal pillars 126A and the upper surfaces of the second metal pillars 126B.

As shown in FIG. 1-7, the bonding pad metal layer 127 is formed over the interlayer dielectric layer 124, the first metal pillars 126A, and the second metal pillars 126B. In the present embodiment, the bonding pad metal layer 127 is formed, for example, by sputtering.

As shown in FIG. 1-8, the metal bonding pad layer 127 is lithographically etched to form the first bonding pad 127A over the first metal pillars 126A and form the second bonding pad 127B over the second metal pillars 126B. The first bonding pad 127A is electrically connected to the first conductive layer 121 by the first metal pillars 126A to form the first electrode, and the second bonding pad 127B is electrically connected to the second conductive layer 123 by the second metal pillars 126B to form the second electrode.

As shown in FIG. 1-9, the protection layer 13 is formed to respectively cover the first bonding pad 127A, the second bonding pad 127B, and the exposed interlayer dielectric layer 124. In the present embodiment, the protection layer 13 may be formed by deposition.

As shown in FIG. 1-10, the protection layer 13 is lithographically etched to form the first bonding pad opening 14A exposing the first bonding pad 127A and the second bonding pad opening 14B exposing the second bonding pad 127B, respectively.

Second Embodiment

Referring to FIG. 2-1 to FIG. 2-16, FIG. 2-1 to FIG. 2-16 are schematic views illustrating embodiments of the capacitor unit at different manufacture stages according to a second embodiment of the invention.

As shown in FIG. 2-1, the substrate 10 is provided on which the isolation layer 11 is formed. In the present embodiment, the isolation layer 11 is, for example, an underlying insulating layer deposited on the substrate 10 by a chemical vapor deposition (CVD) process or an oxidation process. In one embodiment, the substrate 10 may be, for example, a silicon substrate, but not limited thereto. The substrate 10 may be other types of substrates such as a glass substrate or a quartz substrate.

As shown in FIG. 2-2, the first conductive layer 221 is formed on the isolation layer 11. In the present embodiment, the first conductive layer 221 may be a metal layer formed by sputtering, electroplating, or evaporation, but not limited thereto. The first conductive layer 221 may also be a non-metal layer formed by chemical vapor deposition. That is, in addition to metal, the conductive layer material of the first conductive layer 221 may include a non-metal (e.g., a doped polysilicon, a doped single crystal silicon, or a doped amorphous silicon) or a metal silicide.

As shown in FIG. 2-3, the first conductive layer 221 is lithographically etched to expose the first portion 11a of the isolation layer 11 is.

Figures 1, 2, 3, 4:
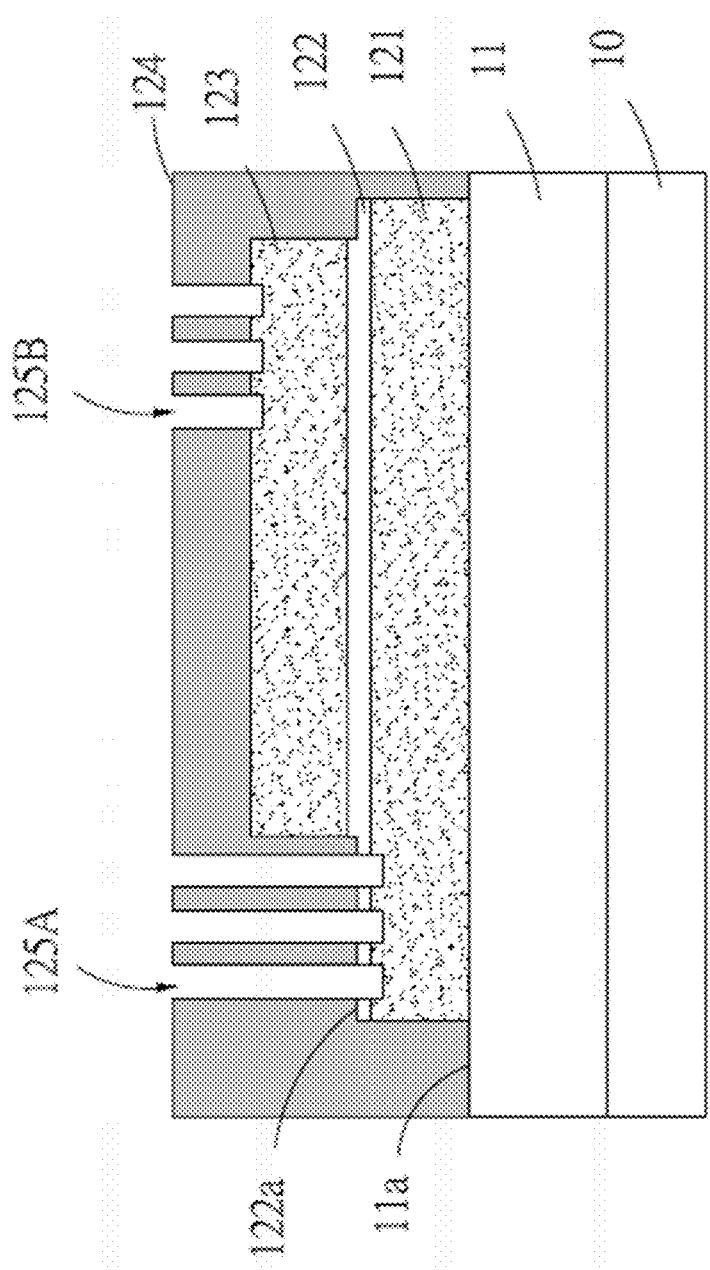

As shown in FIG. 2-4, the interlayer dielectric layer 2215 is deposited on the first conductive layer 221 and on the first portion 11a of the isolation layer 11.

As shown in FIG. 2-5, the interlayer dielectric layer 2215 is etched back to remove the interlayer dielectric layer 2215 above the first conductive layer 221 and remove a portion of the interlayer dielectric layer 2215 above the first portion 11a of the isolation layer 11, thereby forming the spacer 2215a and the spacer 2215b connected to two sidewalls of the first conductive layer 221.

As shown in FIG. 2-6, the capacitor dielectric layer 222 is formed to cover the first conductive layer 221, the spacers 2215a, 2215b and the first portion 11a of the isolation layer 11, wherein the capacitor dielectric layer 222 includes the third portion 222a directly formed above the first portion 11a of the isolation layer 11, and the capacitor dielectric layer 222 and the sidewalls of the first conductive layer 221 are isolated by the spacers 2215a, 2215b, thereby preventing the early breakdown of the capacitor dielectric layer 222 and preventing the capacitor from being disable due to the generation of the breakdown current.

As shown in FIG. 2-7, the second conductive layer 223 is formed on the capacitor dielectric layer 222. In the present embodiment, the second conductive layer 223 may be formed, for example, by sputtering, electroplating, or evaporation, but not limited thereto. However, the second conductive layer 223 may also be a non-metal layer formed by chemical vapor deposition. That is, in addition to metal, the conductive layer material of the second conductive layer 223 may include a non-metal (e.g., a doped polysilicon, a doped single crystal silicon, or a doped amorphous silicon) or a metal silicide.

As shown in FIG. 2-8, the second conductive layer 223 is lithographically etched to expose the fourth portion 222b of the capacitor dielectric layer 222 above the first conductive layer 221.

As shown in FIG. 2-9, the interlayer dielectric layer 224 is formed to cover the second conductive layer 223 and the fourth portion 222b of the capacitor dielectric layer 222, and the upper surface of the interlayer dielectric layer 224 is planarized by performing a chemical mechanical polishing (CMP) process or an etch back process. In the present embodiment, the interlayer dielectric layer 224 is formed, for example, by deposition.

As shown in FIG. 2-10, the interlayer dielectric layer 224 is etched to form the first via holes 225A and the second via holes 225B, wherein each of the first via holes 225A passes through the fourth portion 222b of the capacitor dielectric layer 222 to expose the first conductive layer 221 under the fourth portion 222b, and each of the second via holes 225B is disposed above the third portion 222a of the capacitor dielectric layer 222 to expose the second conductive layer 223 above the third portion 222a. Since the height of the capacitor dielectric layer 222 is not high, as shown in FIG. 2-10, the first via holes 225A and the second via holes 225B formed in the present embodiment are approximately equal in height.

As shown in FIG. 2-11, for example, a physical vapor deposition (PVD) process, a chemical vapor deposition (CVD) process, or a combination of both is performed to form the metal material 226 over the interlayer dielectric layer 224, and the first via holes 225A and the second via holes 225B are filled with the metal material 226. Generally, the metal material 226 formed in the first via holes 225A and the second via holes 225B is mainly tungsten, and the metal material 226 may include a layer of titanium nitride/titanium composite material as an adhesive layer (not shown). The adhesive layer is typically formed by physical vapor deposition (PVD), so the metal material 226 may be composed of a composite material.

As shown in FIG. 2-12, for example, a chemical mechanical polishing (CMP) process or an etch back process is performed to remove the metal material 226 on the upper surface of the interlayer dielectric layer 224 and remove the metal material 226 outside the first via holes 225A and second via holes 225B, thereby forming the first metal pillars 226A and the second metal pillars 226B in the first via holes 225A and the second via holes 225B. As a result of performing the planarization process described above, the upper surface of the interlayer dielectric layer 224 is flush with the upper surfaces of the first metal pillars 226A and the upper surfaces of the second metal pillars 226B. In addition, since the first via holes 225A and the second via holes 225B are approximately equal in height, the first metal pillars 226A and the second metal pillars 226B are approximately equal in height.

As shown in FIG. 2-13, the bonding pad metal layer 227 is formed over the interlayer dielectric layer 224, the first metal pillars 226A, and the second metal pillars 226B. In the present embodiment, the bonding pad metal layer 227 is formed, for example, by sputtering. Next, as shown in FIG. 2-14, the metal bonding pad layer 227 is lithographically etched to form the first bonding pad 227A over the first metal pillars 226A and form the second bonding pad 227B over the second metal pillars 226B. The first bonding pad 227A is electrically connected to the first conductive layer 221 by the first metal pillars 226A to form the first electrode, and the second bonding pad 227B is electrically connected to the second conductive layer 223 by the second metal pillars 226B to form the second electrode.

As shown in FIG. 2-15, the protection layer 13 is formed to respectively cover the first bonding pad 227A, the second bonding pad 227B, and the exposed interlayer dielectric layer 224. In the present embodiment, the protection layer 13 may be formed by deposition. Next, as shown in FIG. 2-16, the protection layer 13 is lithographically etched to form the first bonding pad opening 14A exposing the first bonding pad 227A and the second bonding pad opening 14B exposing the second bonding pad 227B, respectively.

Third Embodiment

Referring to FIG. 3-1 to FIG. 3-20, FIG. 3-1 to FIG. 3-20 are schematic views illustrating embodiments of the capacitor unit at different manufacture stages according to a third embodiment of the invention.

As shown in FIG. 3-1, the substrate 10 is provided on which the isolation layer 11 is formed. In the present embodiment, the isolation layer 11 is, for example, an underlying insulating layer deposited on the substrate 10 by a chemical vapor deposition (CVD) process or an oxidation process. In one embodiment, the substrate 10 may be, for example, a silicon substrate, but not limited thereto. The substrate 10 may be other types of substrates such as a glass substrate or a quartz substrate.

In the present embodiment, the first capacitor dielectric structure 310 is formed on the isolation layer 11 (as shown in FIG. 3-2 to FIG. 3-8). The first capacitor dielectric structure 310 includes the first conductive layer 311 formed on the isolation layer 11a nd the first capacitor dielectric layer 312 formed on the first conductive layer 311. The first conductive layer 311 includes the first left electrode 311A and the first right electrode 311B isolated from each other. The first capacitor dielectric layer 312 includes first left openings 312A formed above the first left electrode 311A and first right openings 312B formed above the first right electrode 311B.

Specifically, as shown in FIG. 3-2, the first conductive layer 311 is formed on the isolation layer 11. In the present embodiment, the first conductive layer 311 may be a metal layer formed by sputtering, electroplating, or evaporation, but not limited thereto. The first conductive layer 311 may also be a non-metal layer formed by chemical vapor deposition. That is, in addition to metal, the conductive layer material of the first conductive layer 311 may include a non-metal (e.g., a doped polysilicon, a doped single crystal silicon, or a doped amorphous silicon) or a metal silicide. As shown in FIG. 3-3, after the photoresist layer 3114 is formed on the first conductive layer 311, the first conductive layer 311 is etched by an etching process using the photoresist layer 3114 to form the first trench 311C, so that the first left electrode 311A and the first right electrode 311B isolated by the first trench 311C are formed in the first conductive layer 311.

As shown in FIG. 3-4, the photoresist layer 3114 above the first left electrode 311A and the first right electrode 311B is removed.

Figures 1, 2, 3, 4, 5:
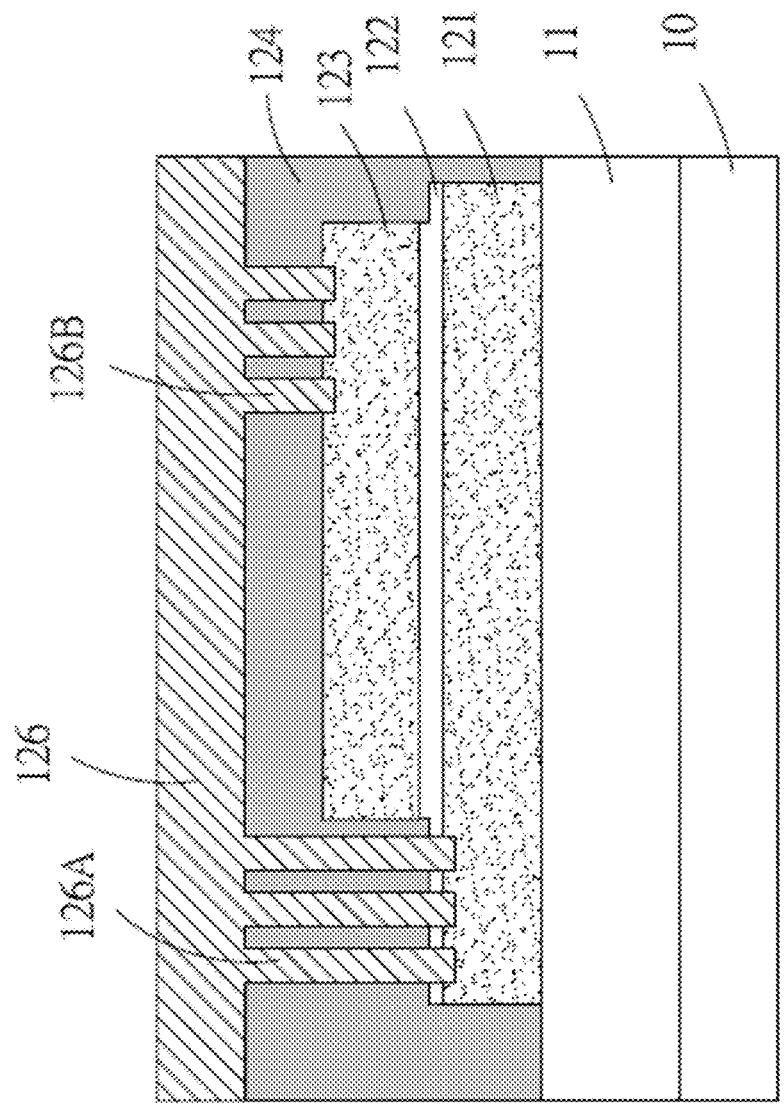
Figures 1, 2, 3, 4, 5, 6:
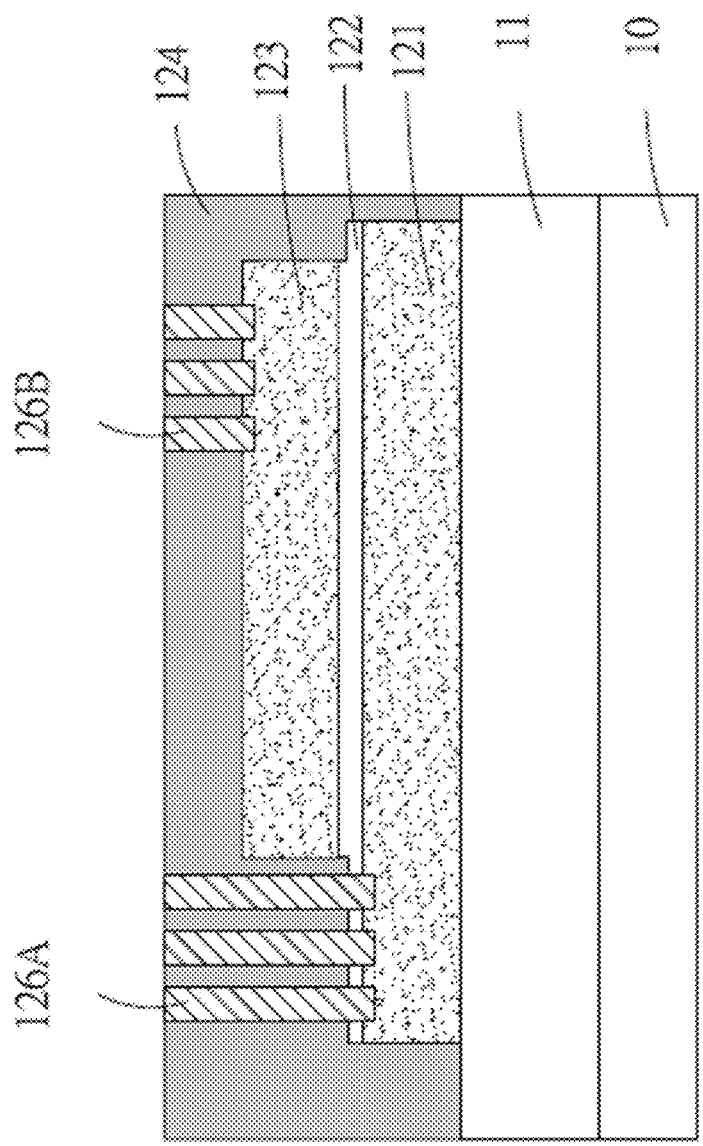
Figures 1, 2, 3, 4, 5, 6, 7:
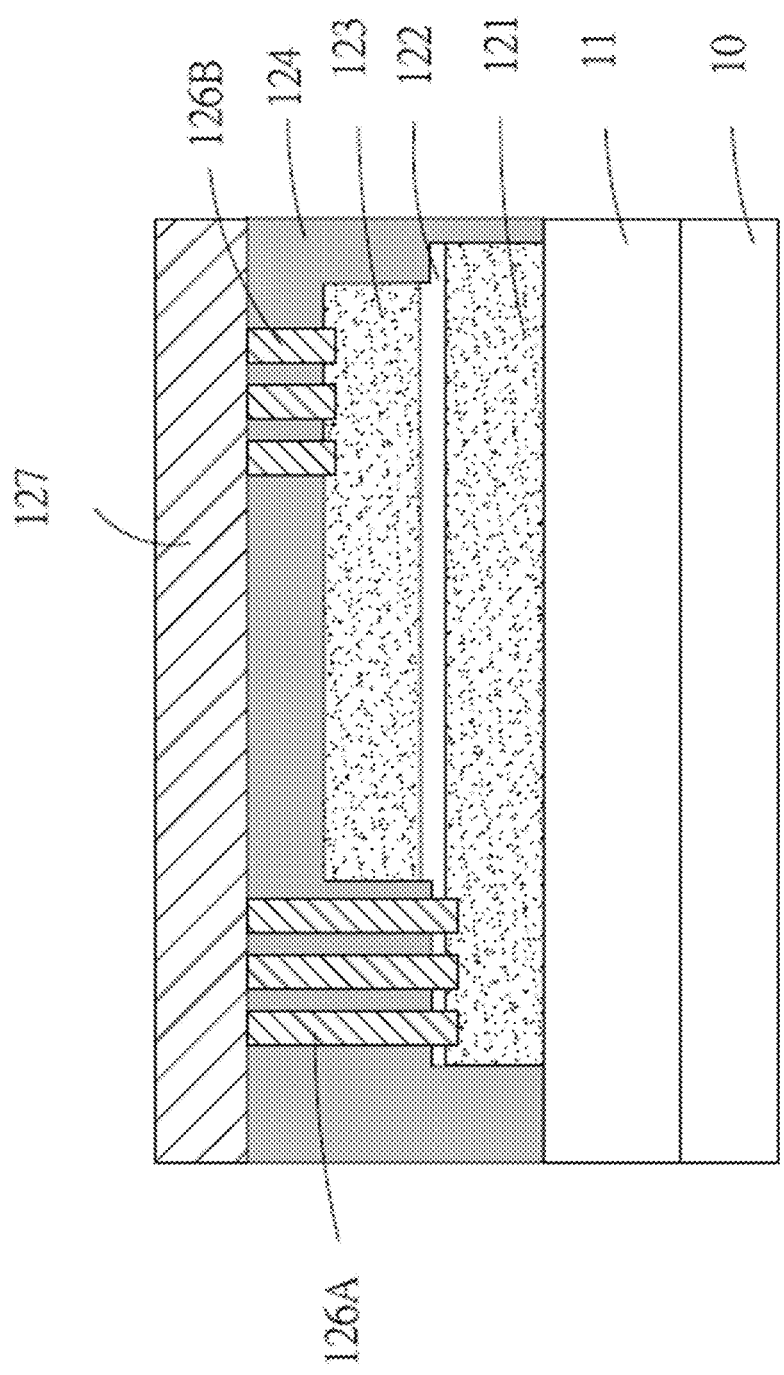
Figures 1, 2, 3, 4, 5, 6, 7, 8:
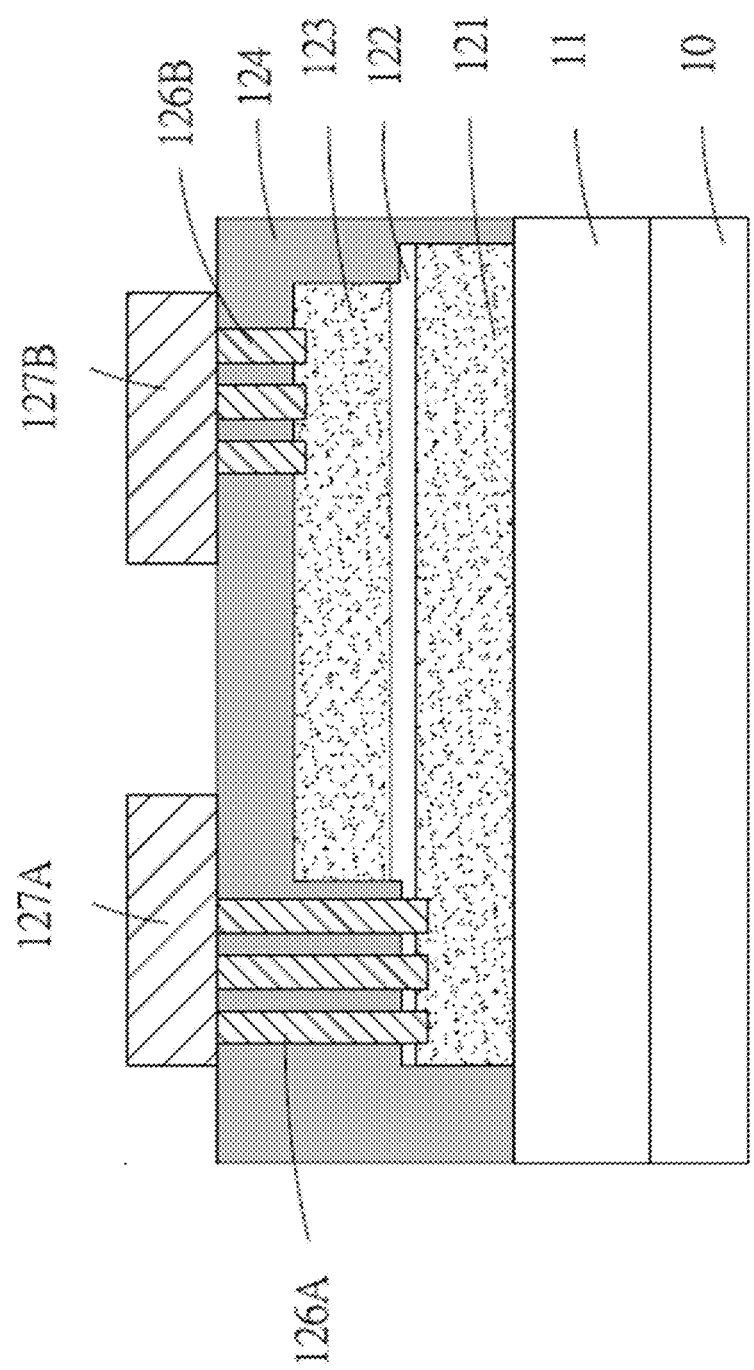
Figures 1, 2, 3, 4, 5, 6, 7, 8, 9:
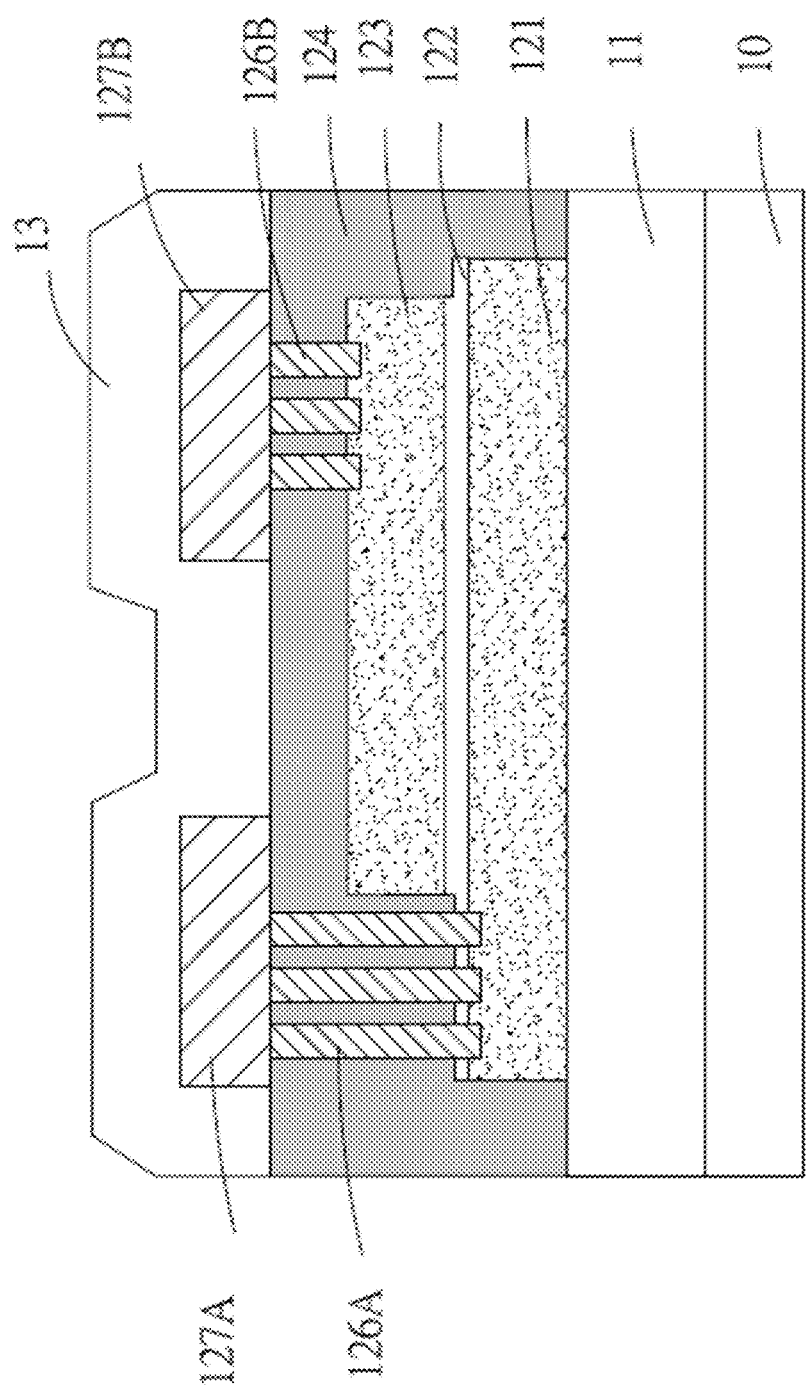
Figures 1, 2, 3, 4, 5, 6, 7, 8, 9, 10:
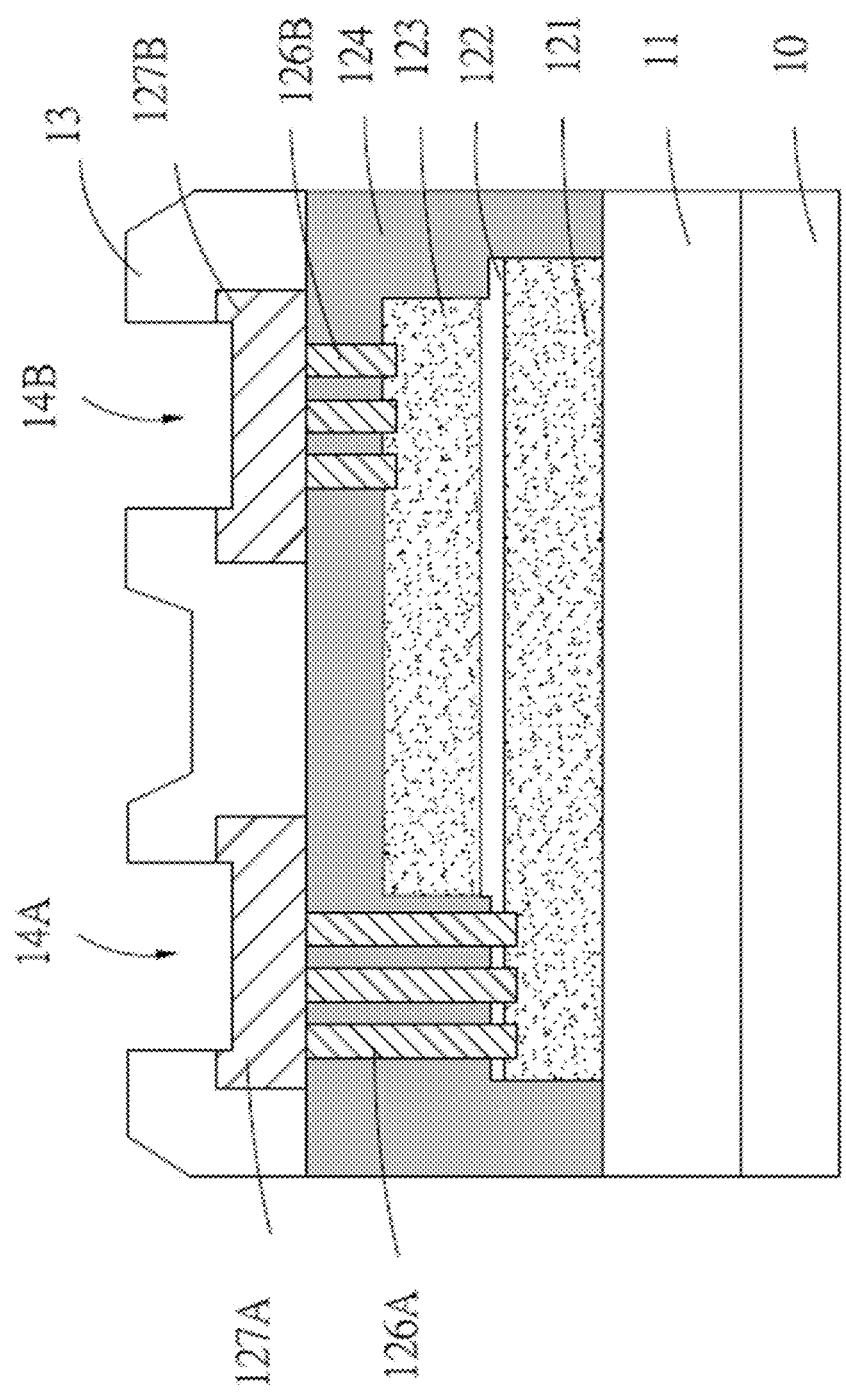
Figures 1, 2:
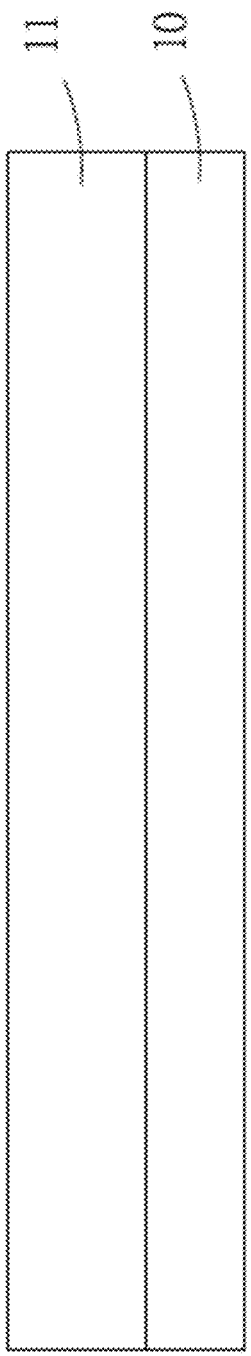
Figure 2:
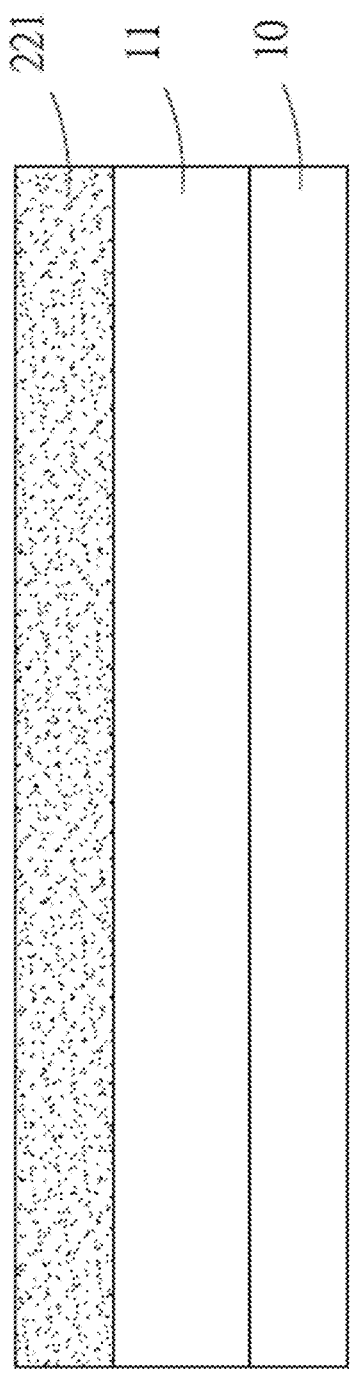
Figures 2, 3:
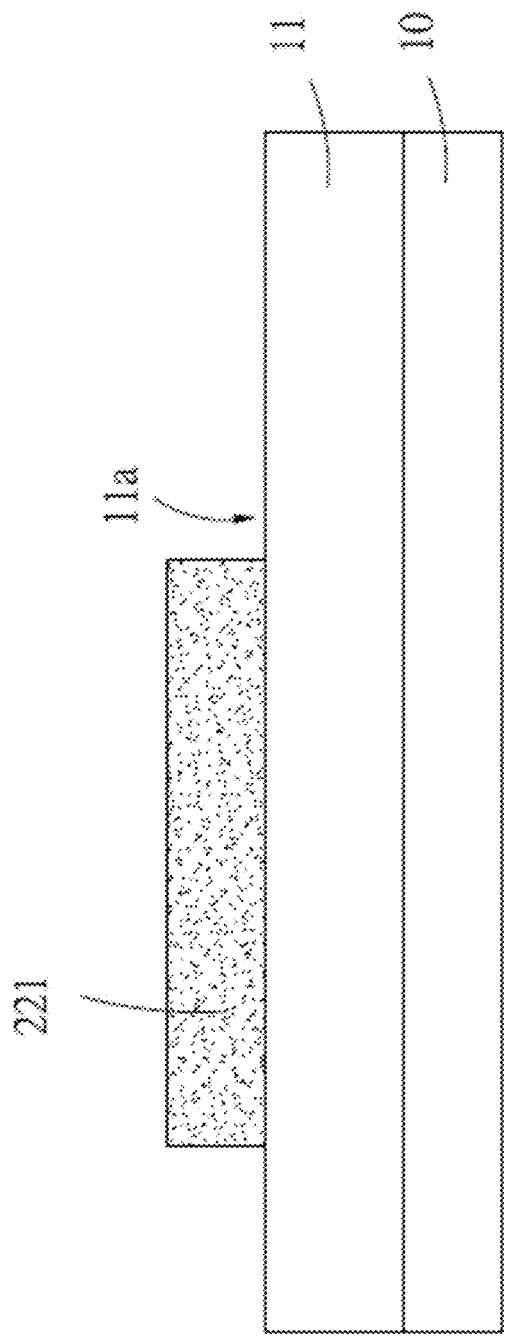
Figures 2, 3, 4:
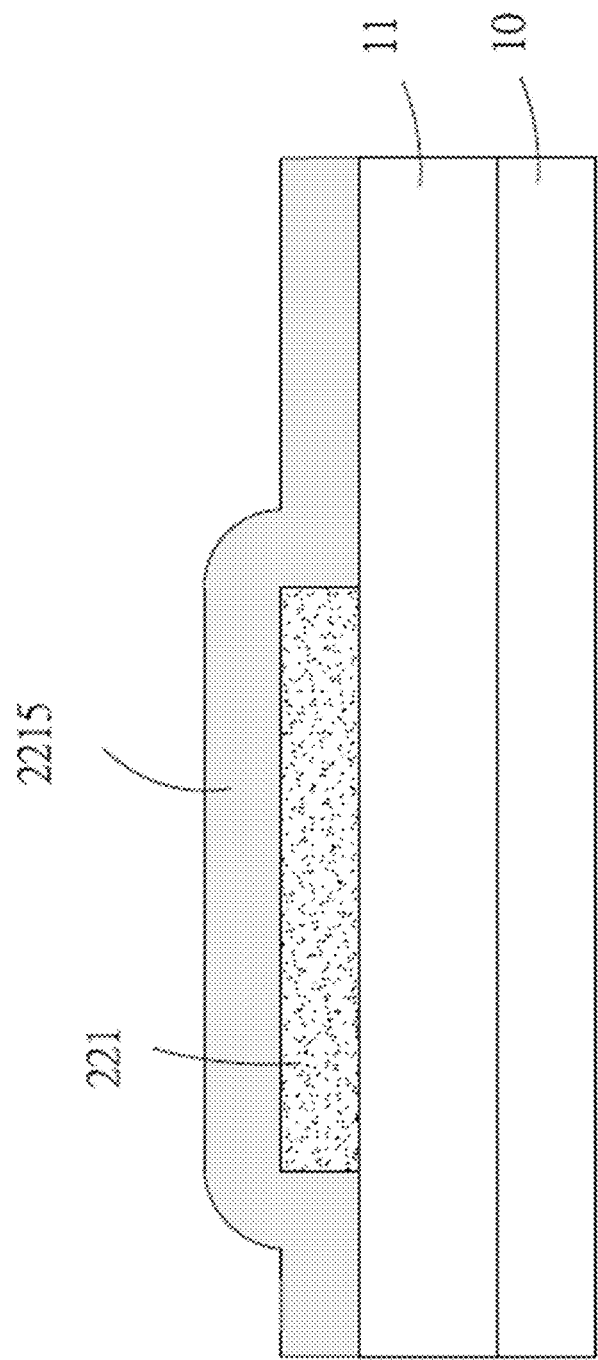
Figures 2, 3, 4, 5:
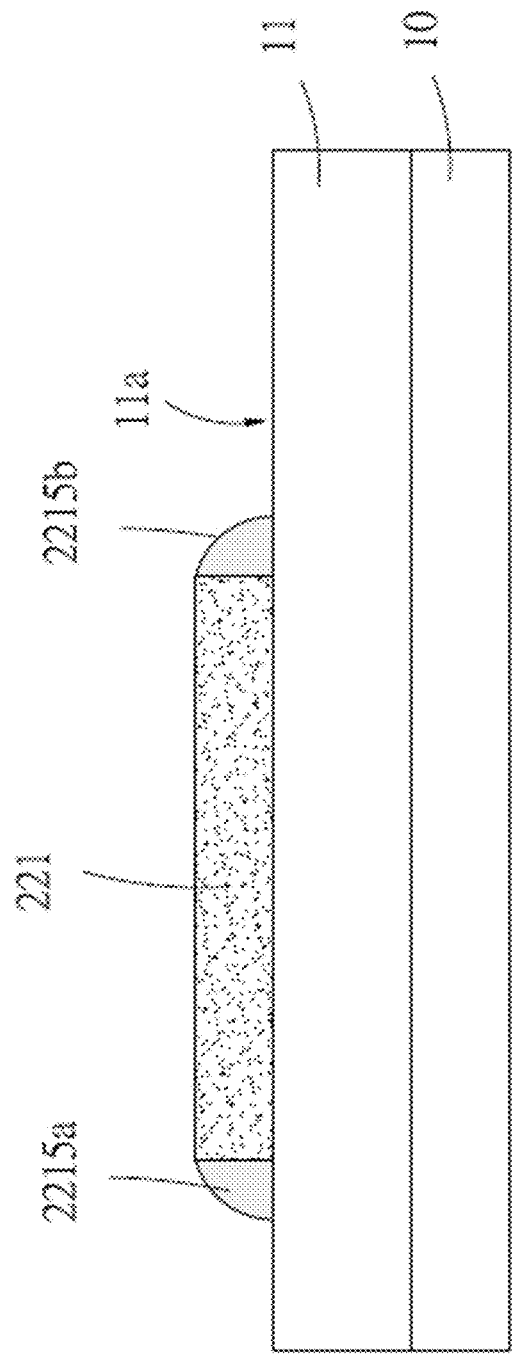
Figures 2, 3, 4, 5, 6:
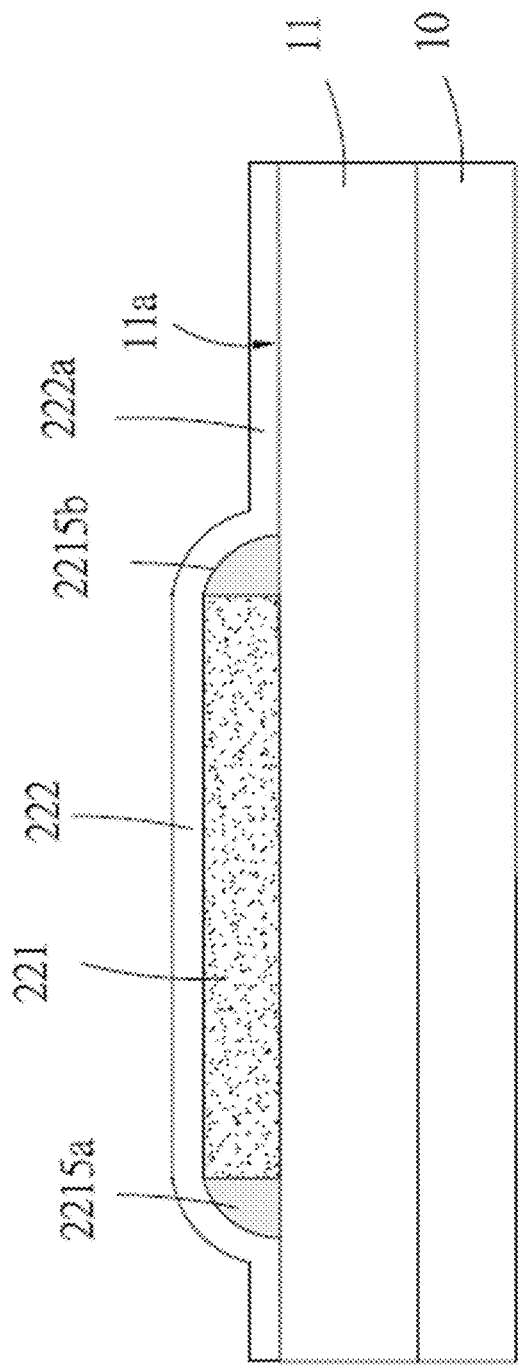
Figures 2, 3, 4, 5, 6, 7:
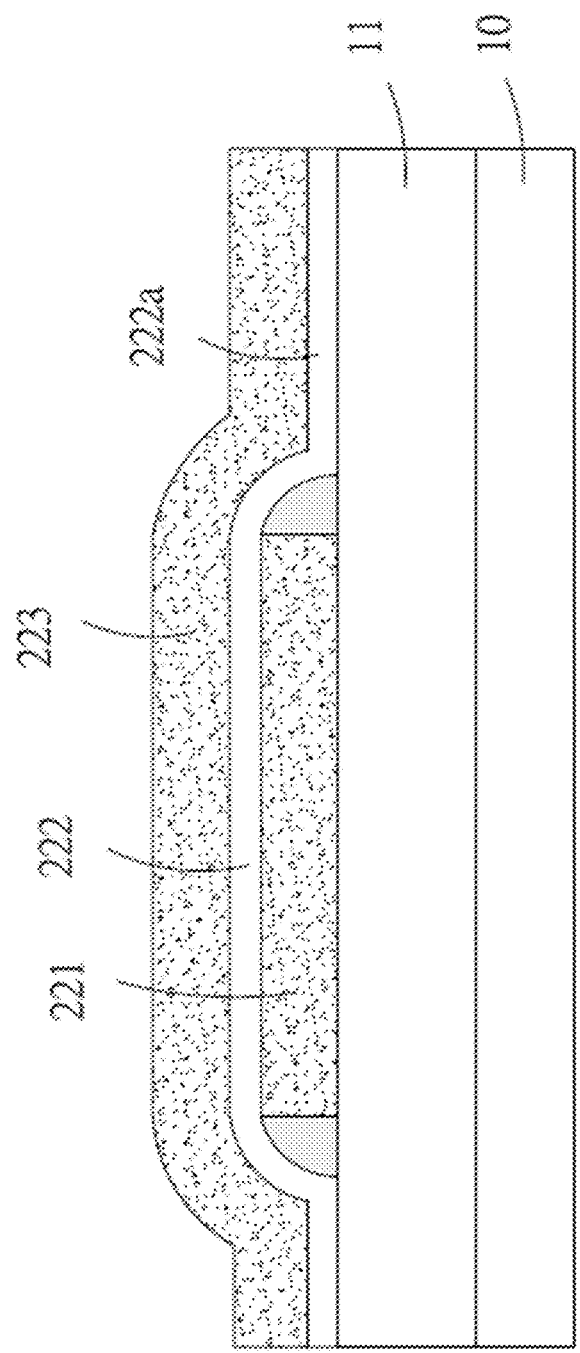
Figures 2, 3, 4, 5, 6, 7, 8:
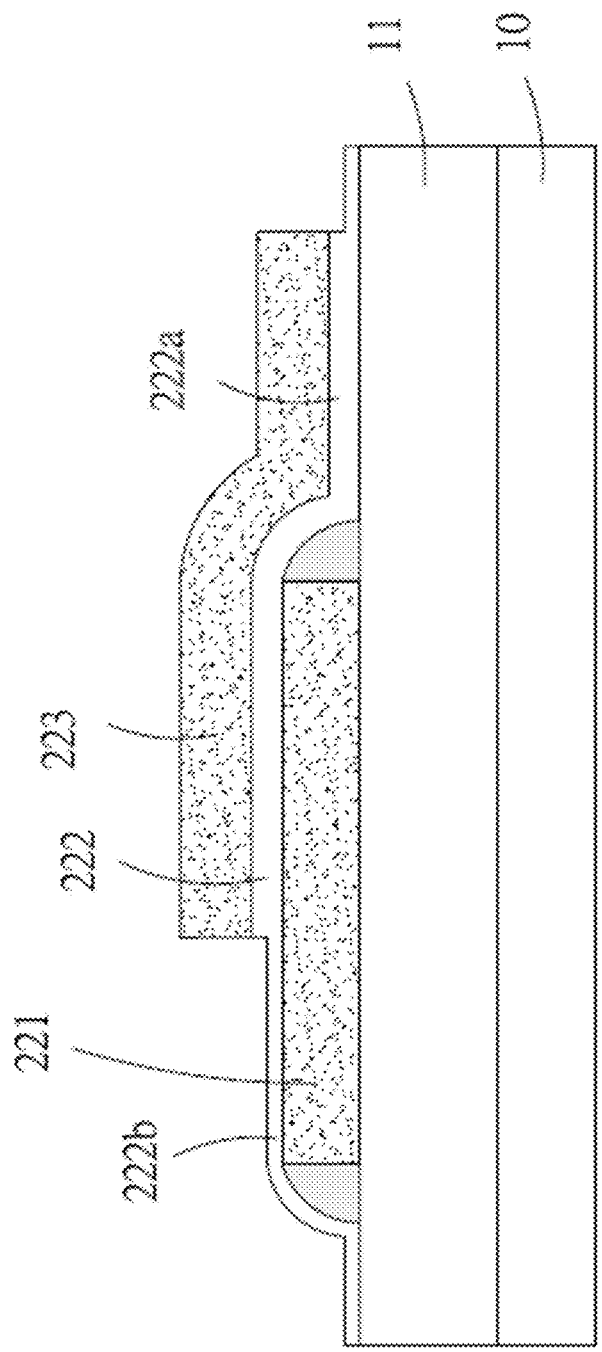
Figures 2, 3, 4, 5, 6, 7, 8, 9:
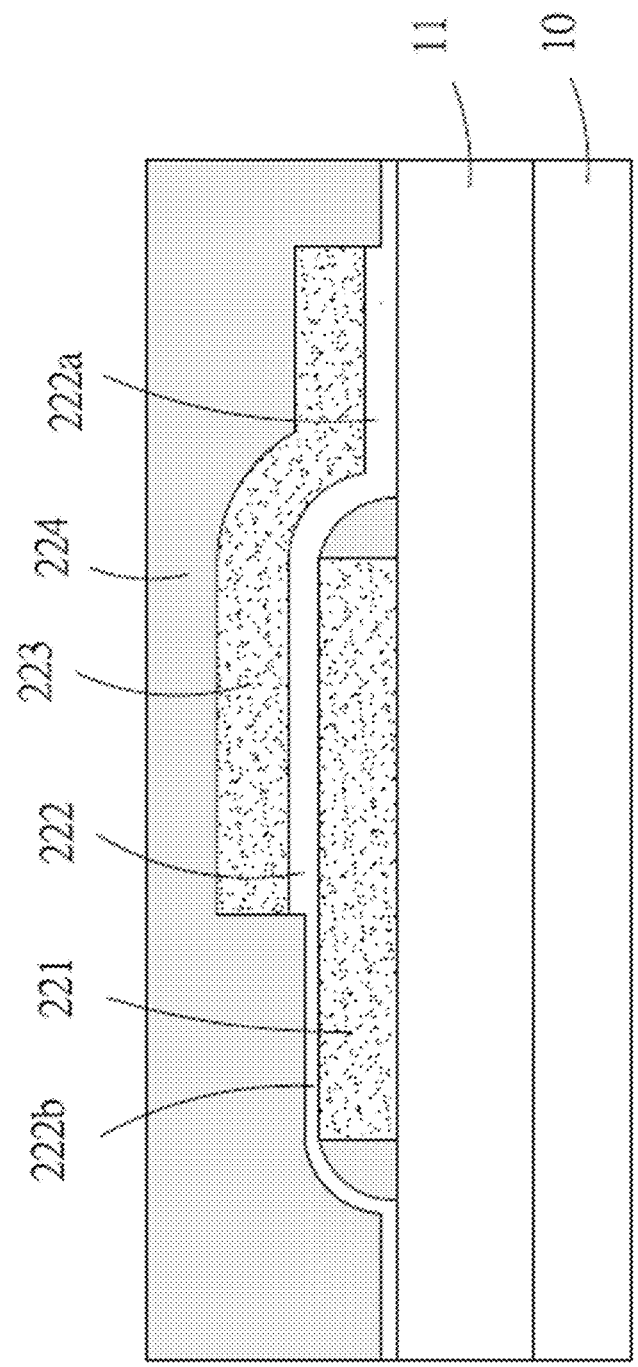
Figures 2, 3, 4, 5, 6, 7, 8, 9, 10:
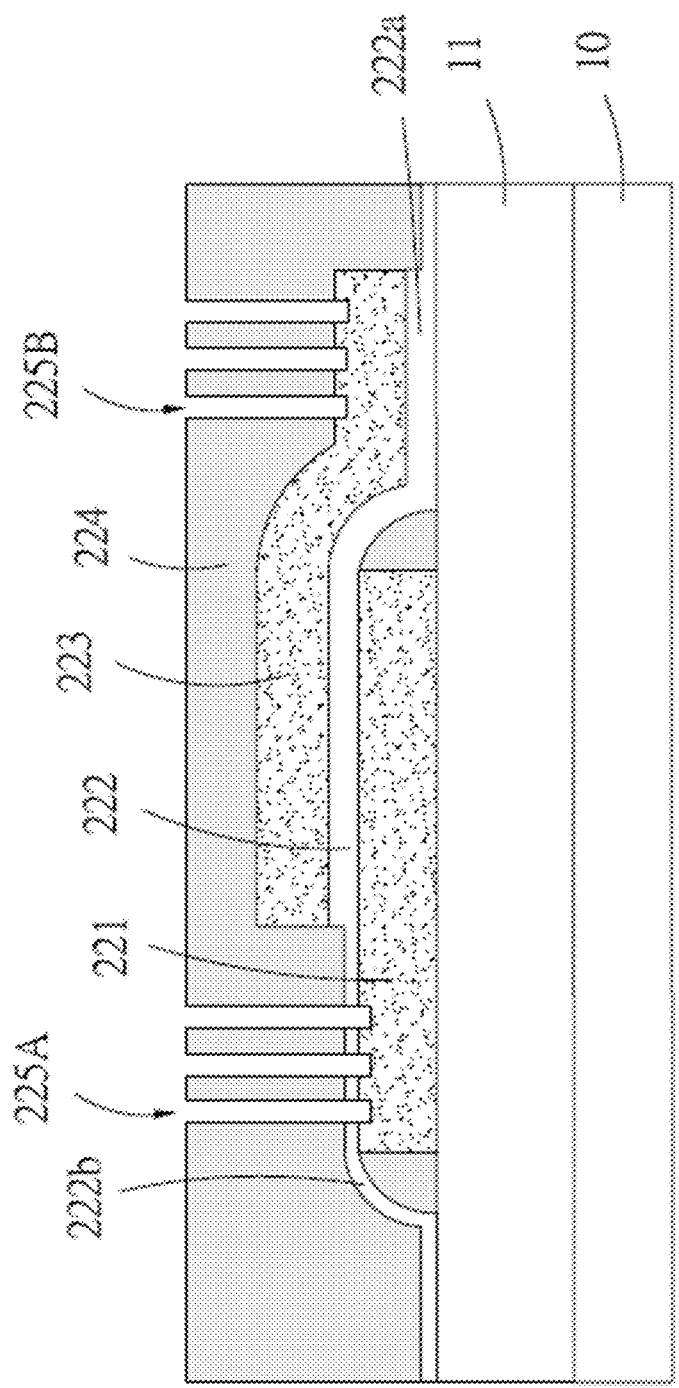
Figures 2, 3, 4, 5, 6, 7, 8, 9, 10, 11:
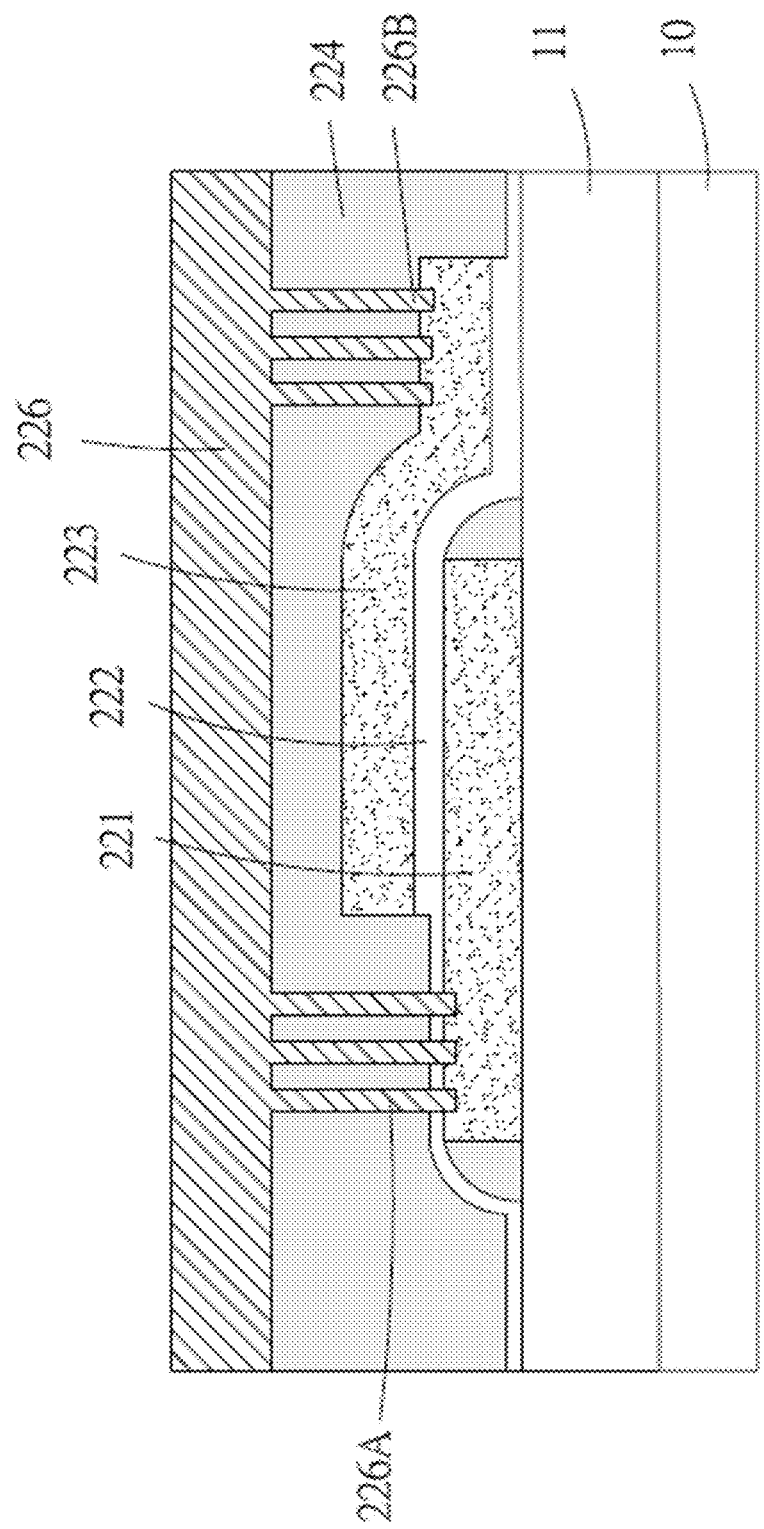
Figures 2, 3, 4, 5, 6, 7, 8, 9, 10, 11, 12:
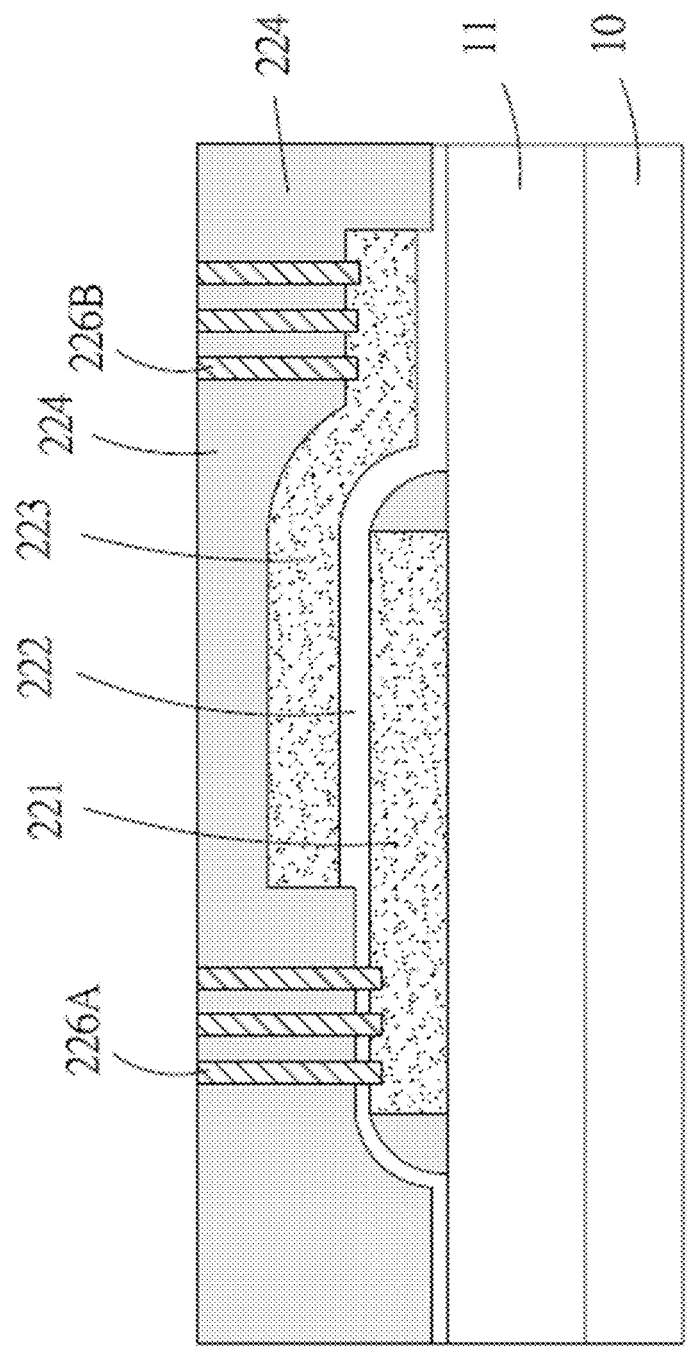
Figures 2, 3, 4, 5, 6, 7, 8, 9, 10, 11, 12, 13:
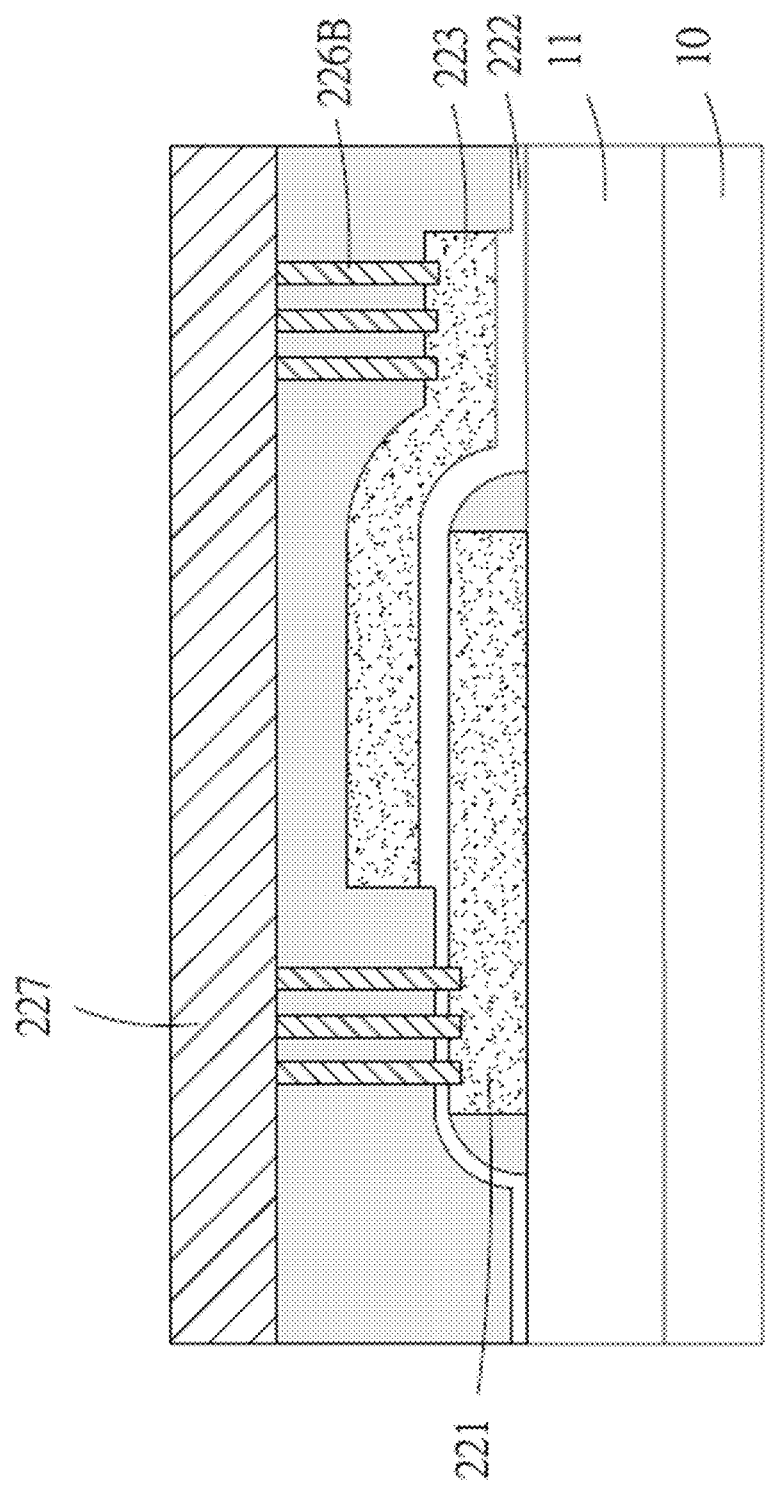
Figures 2, 3, 4, 5, 6, 7, 8, 9, 10, 11, 12, 13, 14:
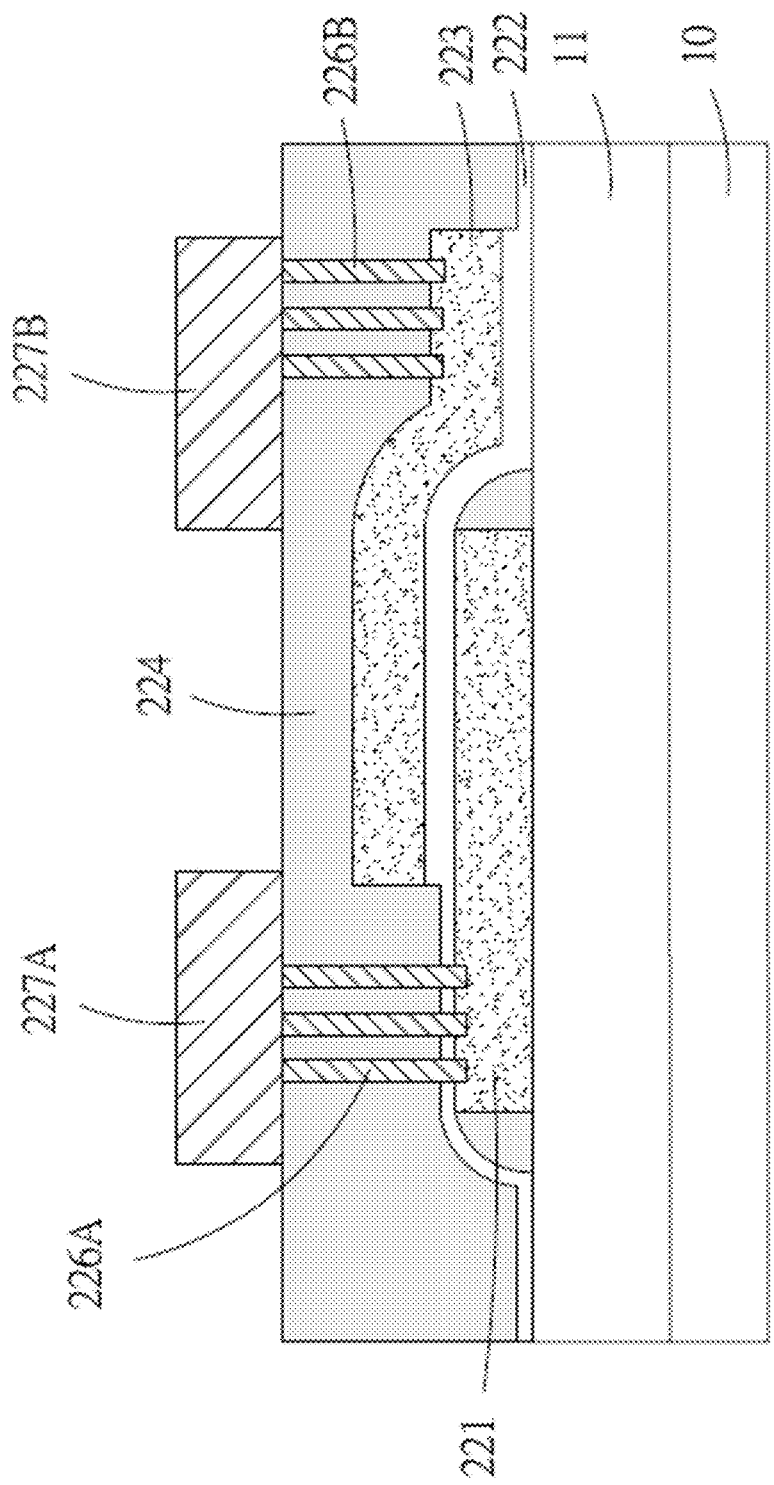
Figures 2, 3, 4, 5, 6, 7, 8, 9, 10, 11, 12, 13, 14, 15:
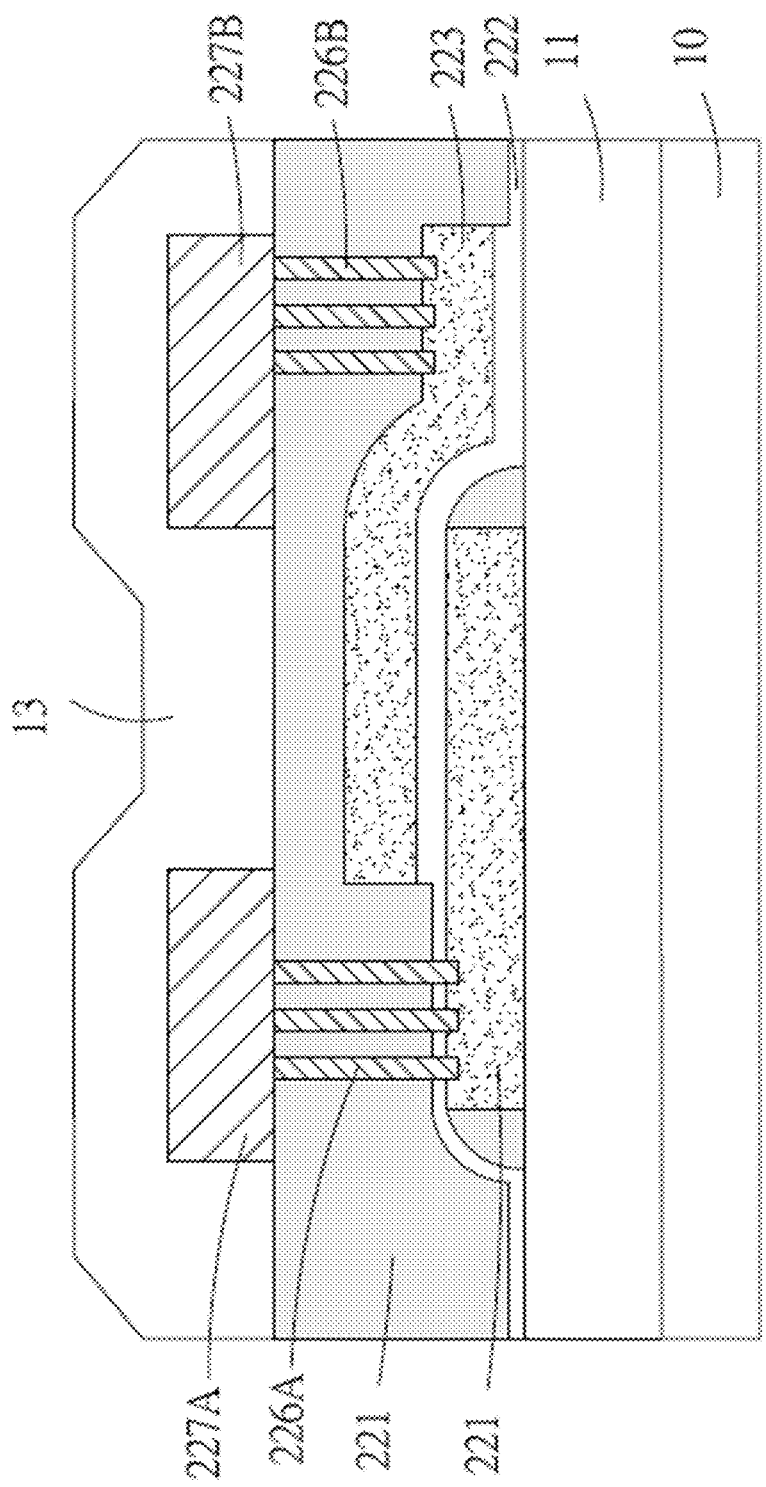
Figures 2, 3, 4, 5, 6, 7, 8, 9, 10, 11, 12, 13, 14, 15, 16:
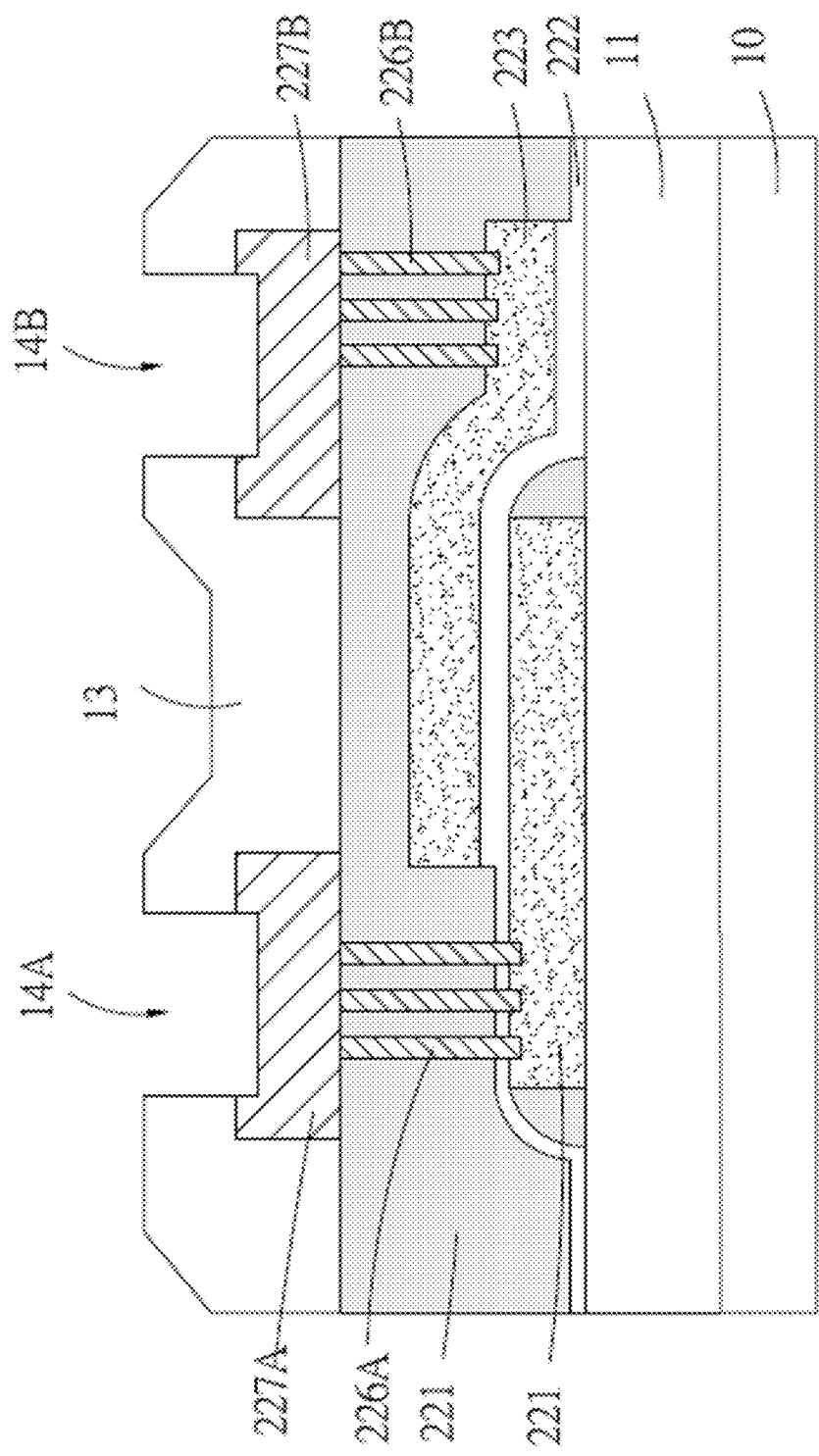
Figures 1, 3:
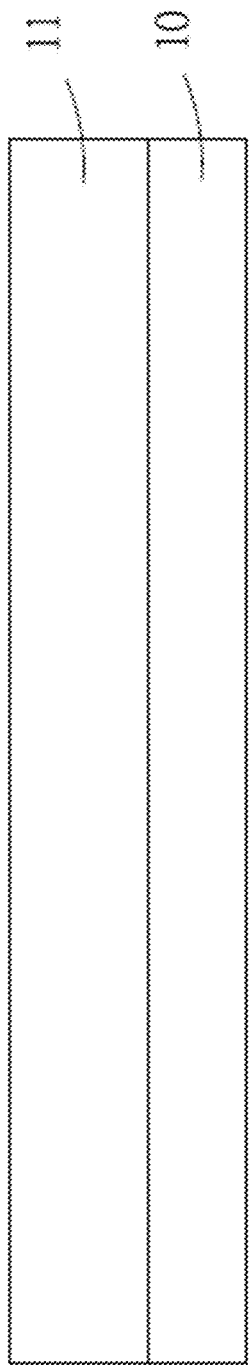
Figures 2, 3:
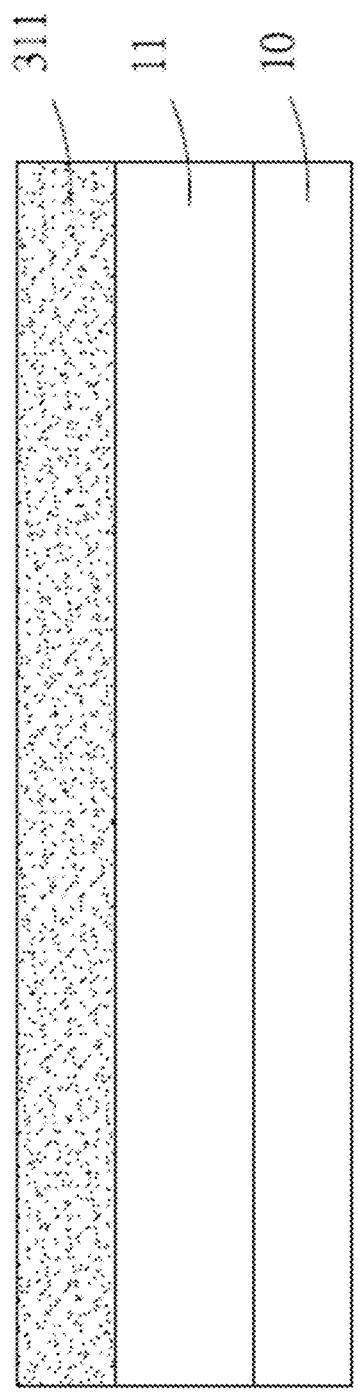
Figure 3:
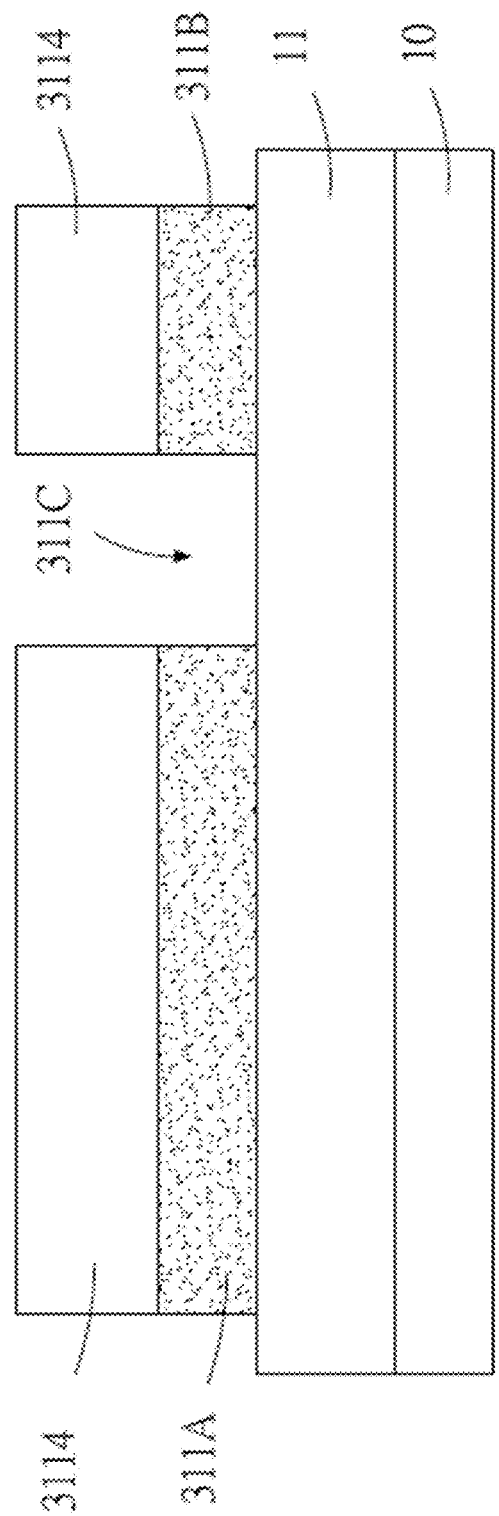
Figures 3, 4:
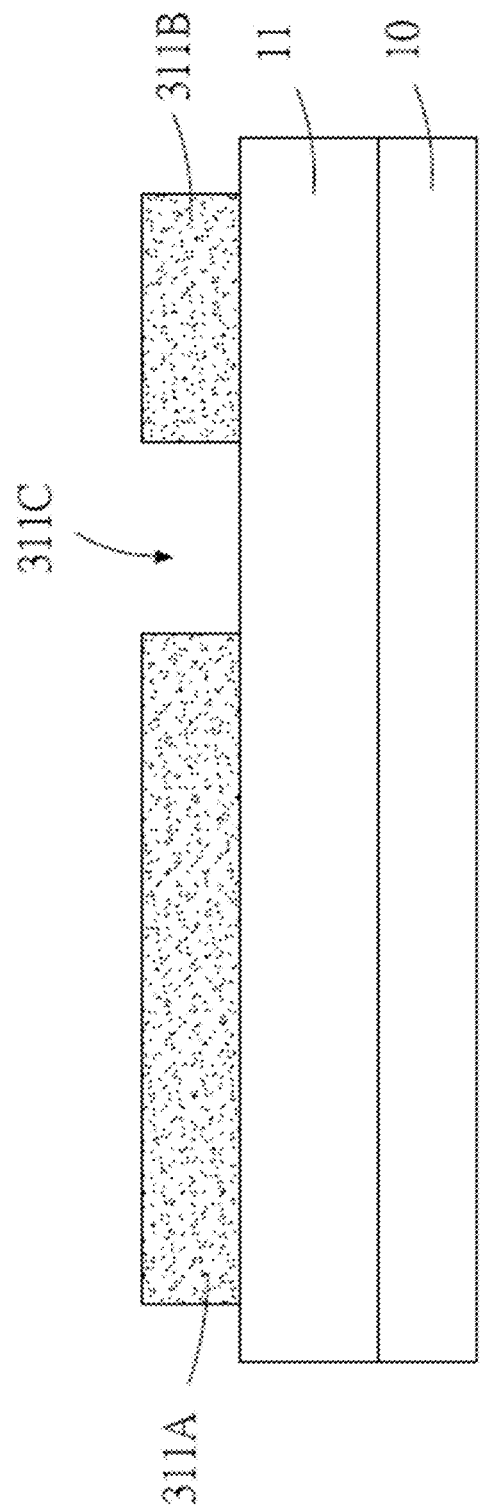
Figures 3, 4, 5:
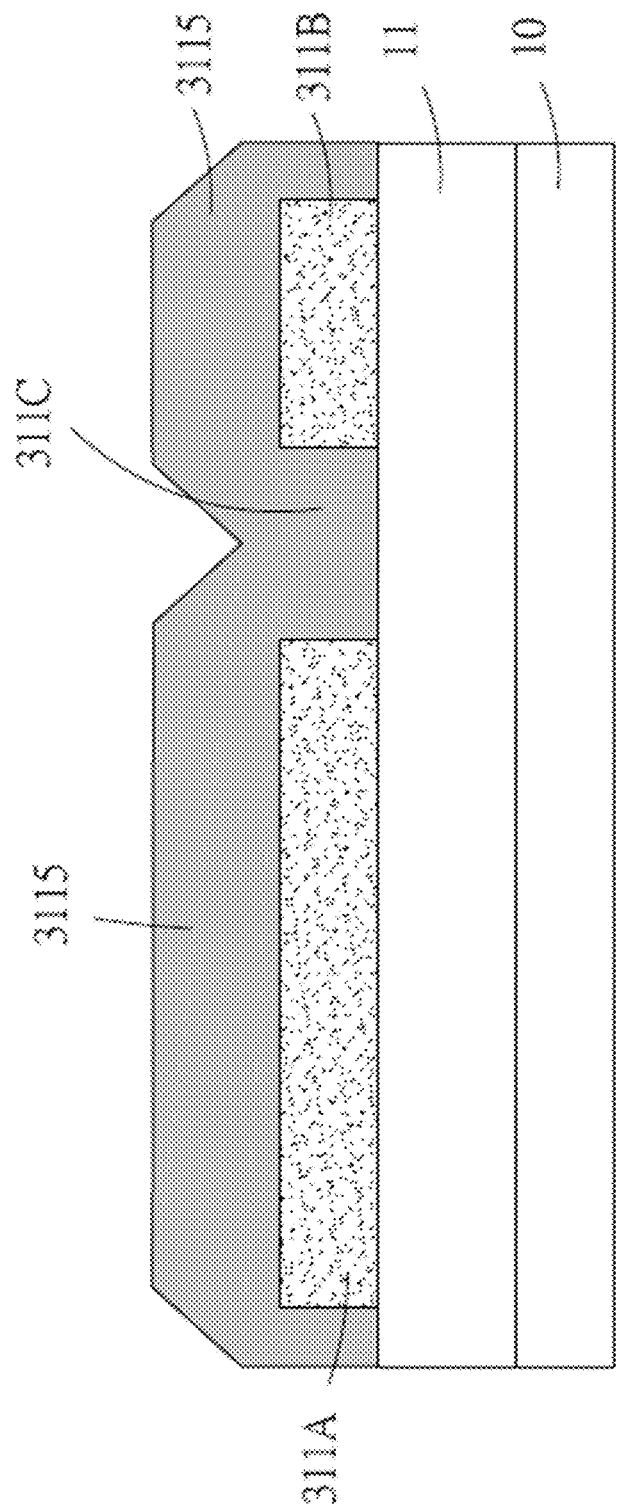
Figures 3, 4, 5, 6:
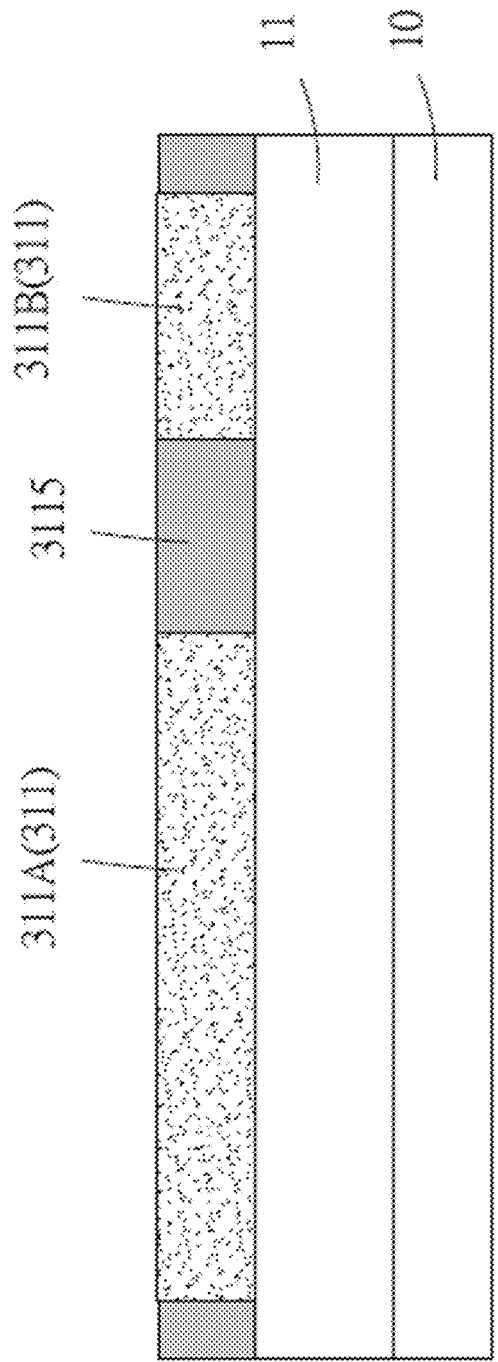
Figures 3, 4, 5, 6, 7:
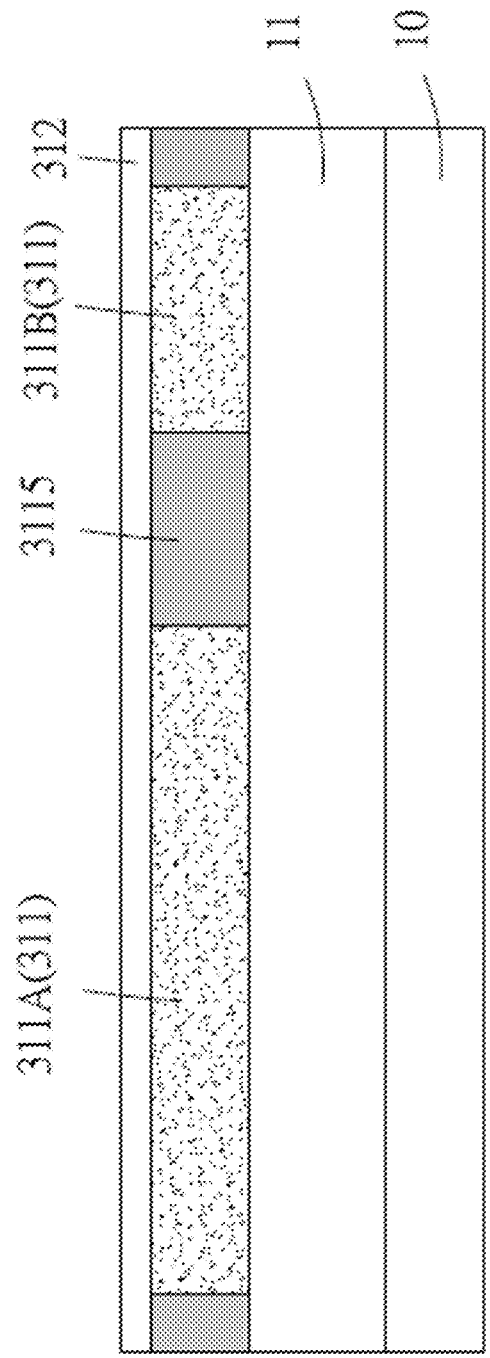
Figures 3, 4, 5, 6, 7, 8:
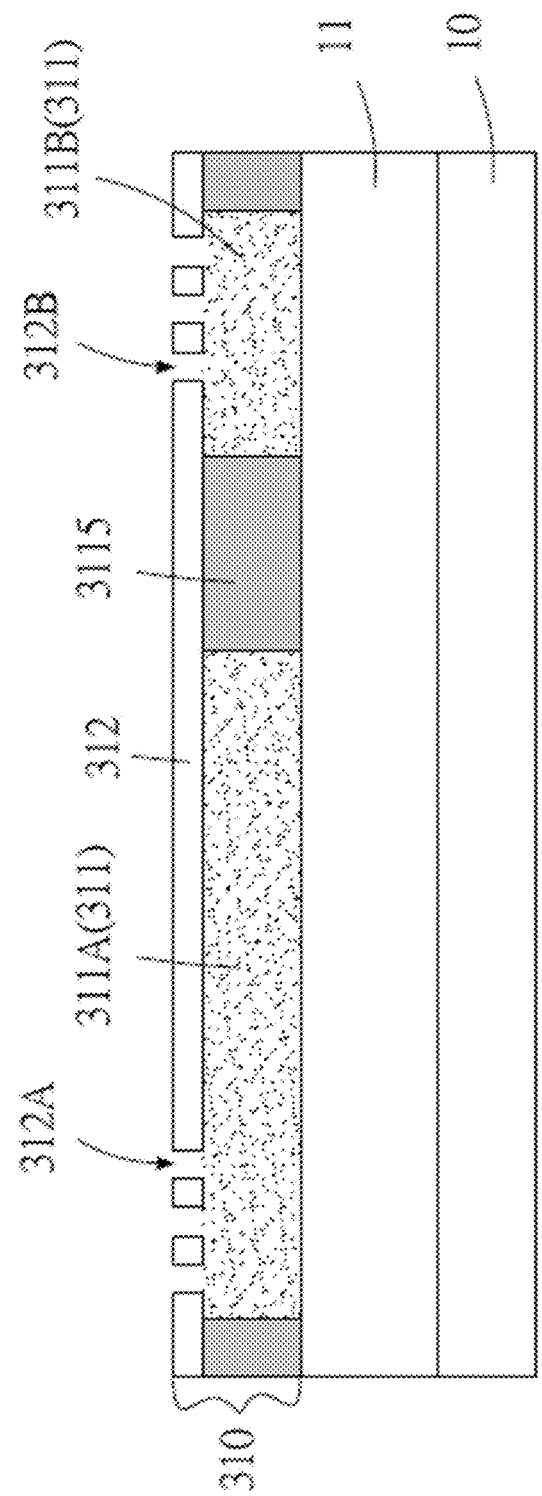
Figures 3, 4, 5, 6, 7, 8, 9:
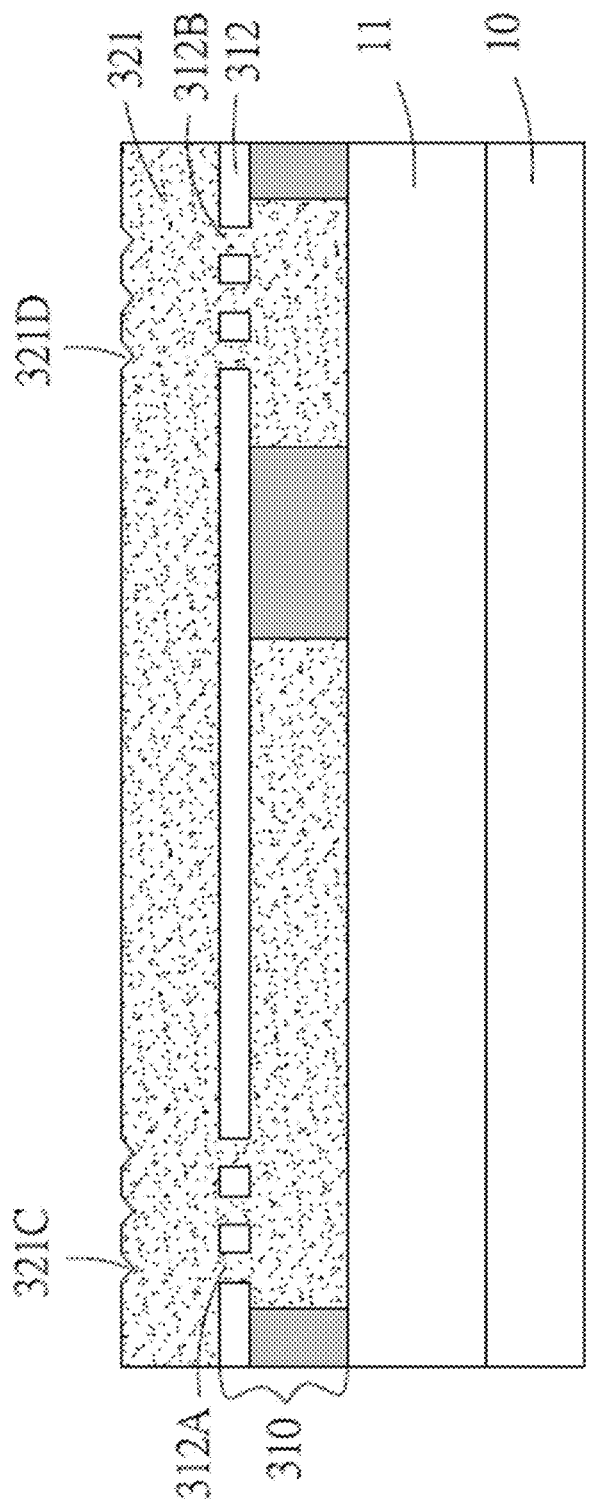
Figures 3, 4, 5, 6, 7, 8, 9, 10:
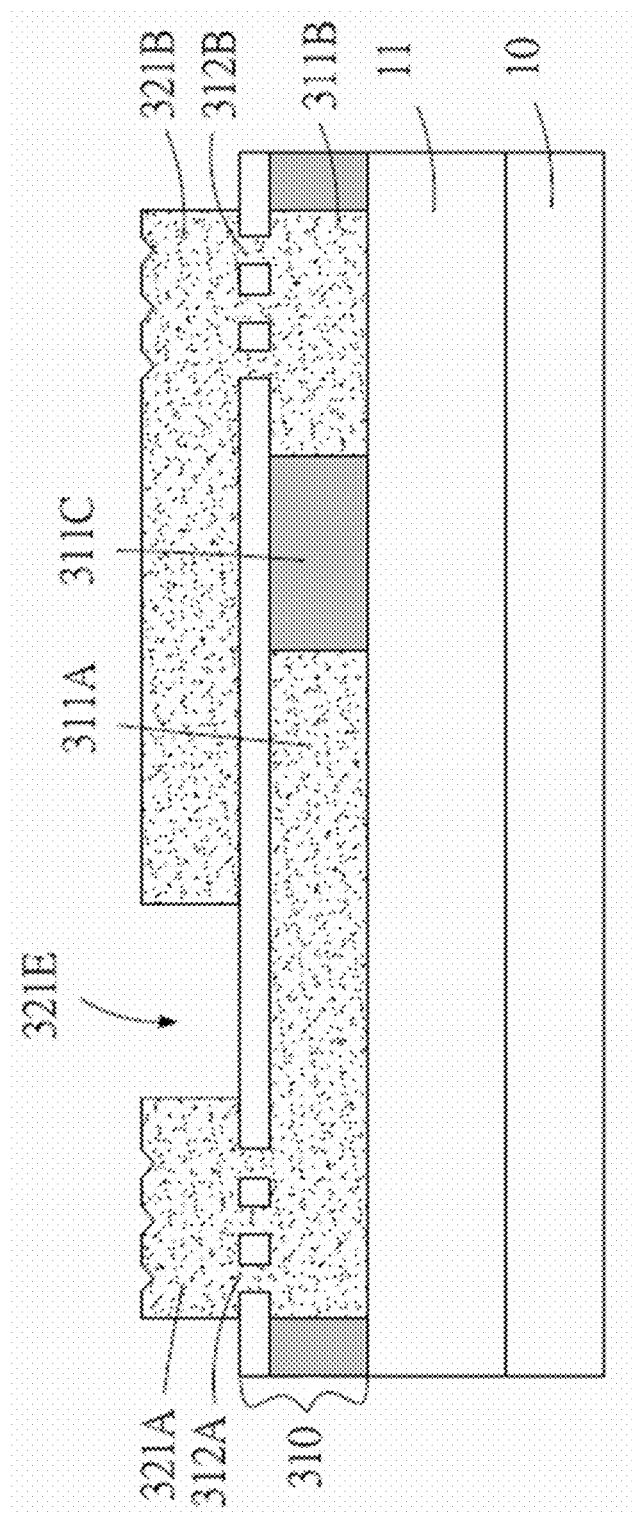
Figures 3, 4, 5, 6, 7, 8, 9, 10, 11:
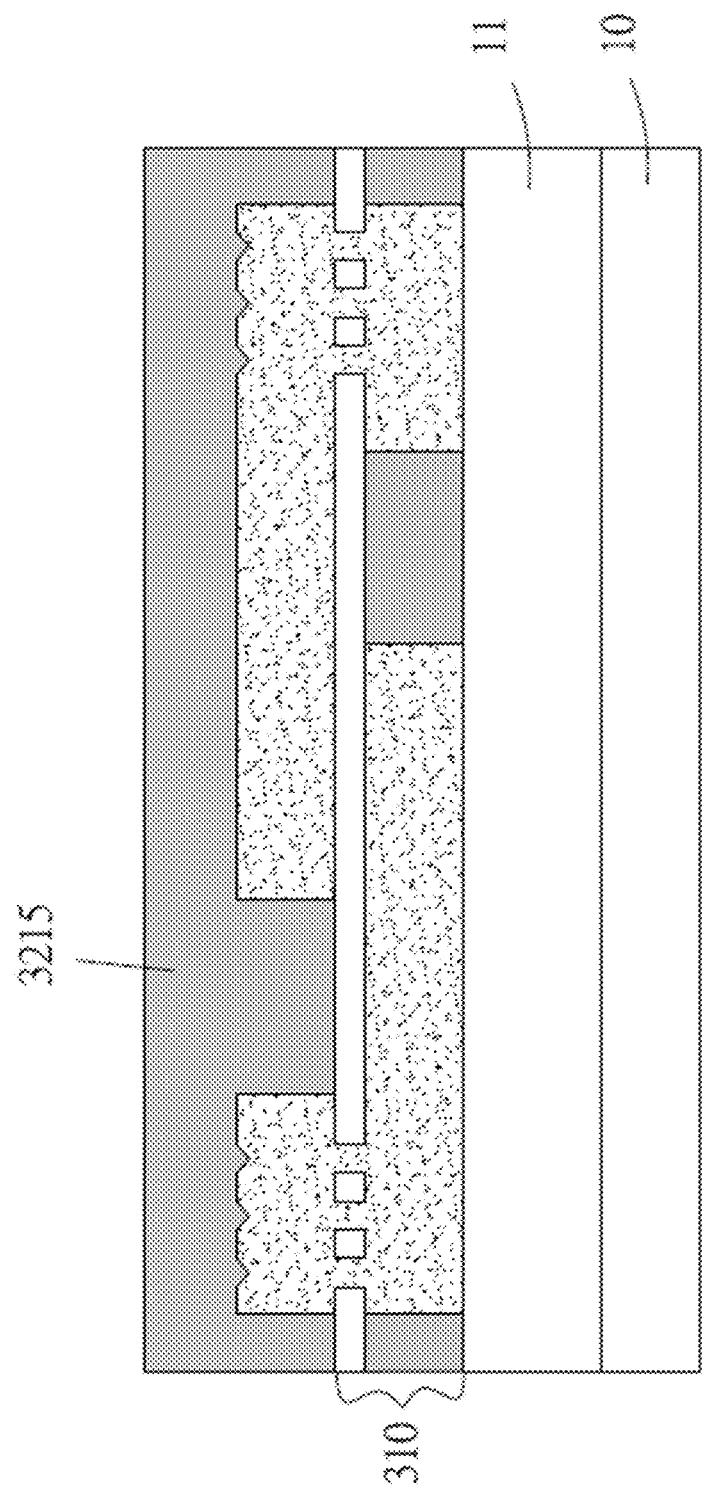
Figures 3, 4, 5, 6, 7, 8, 9, 10, 11, 12:
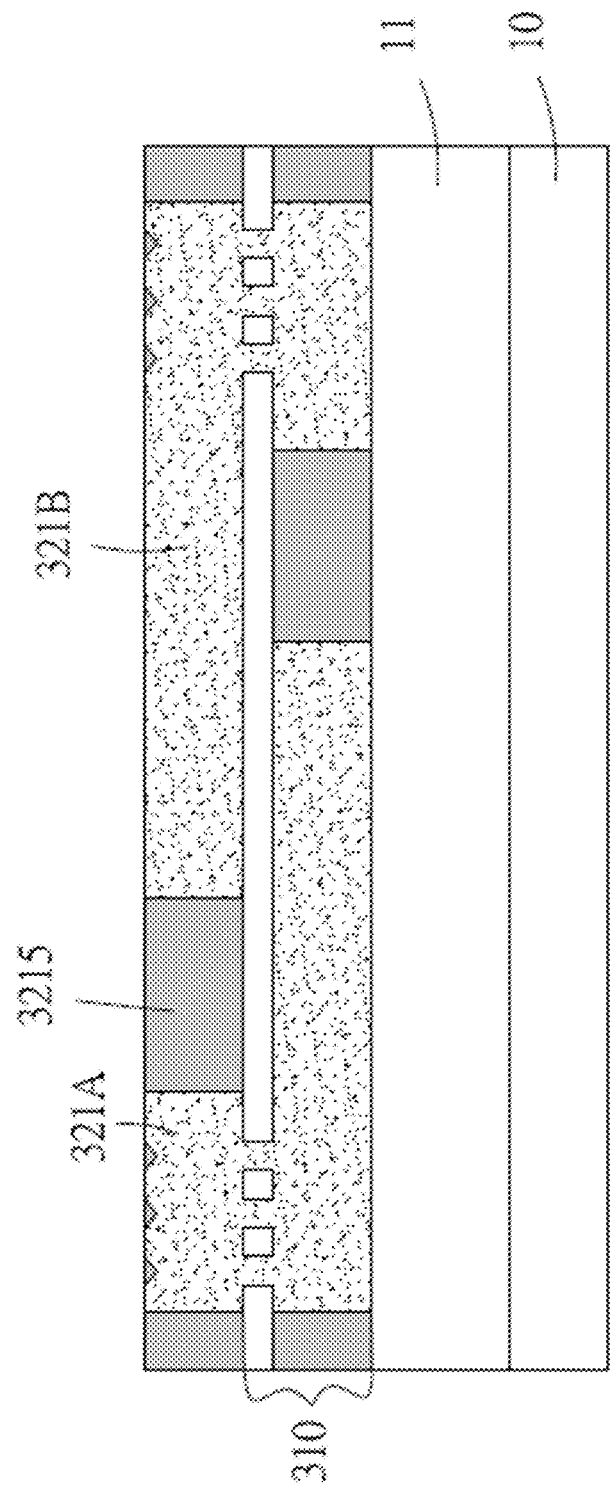
Figures 3, 4, 5, 6, 7, 8, 9, 10, 11, 12, 13:
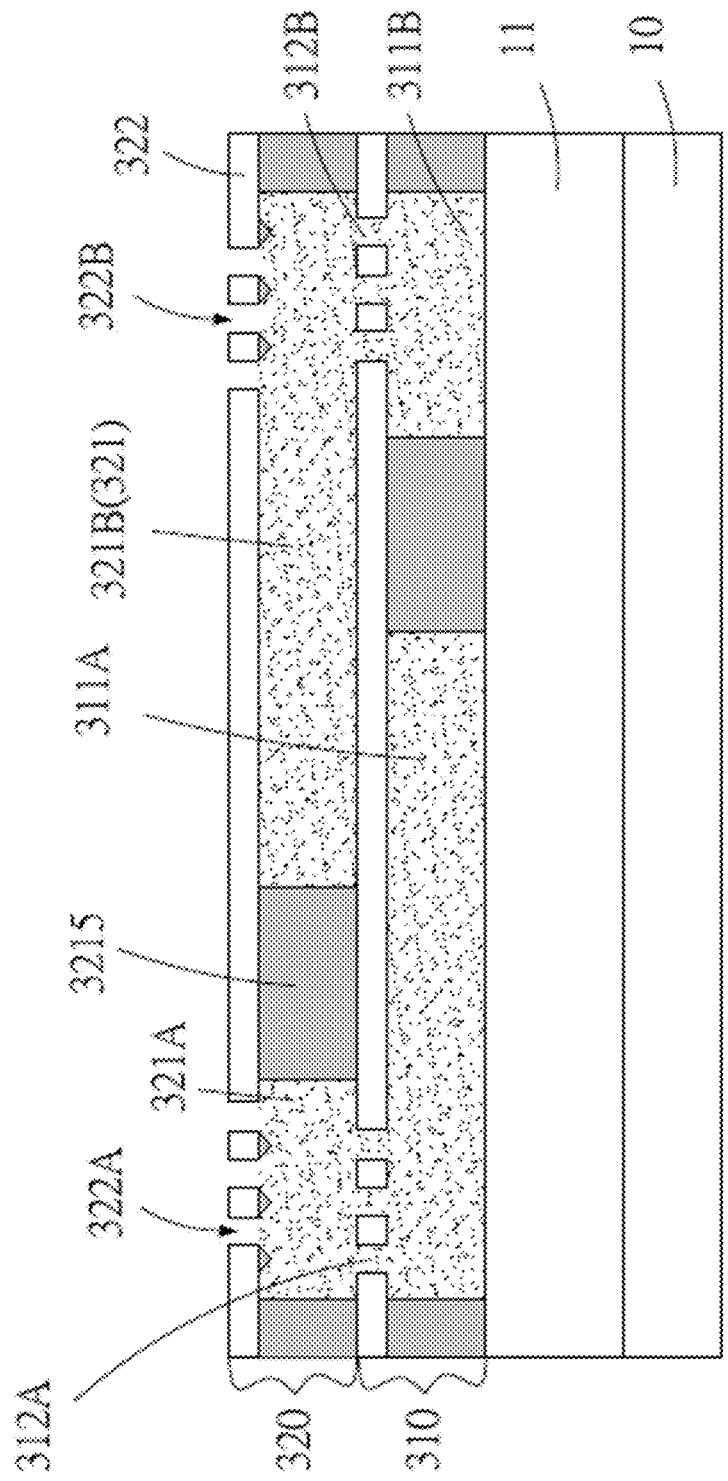
Figures 3, 4, 5, 6, 7, 8, 9, 10, 11, 12, 13, 14:
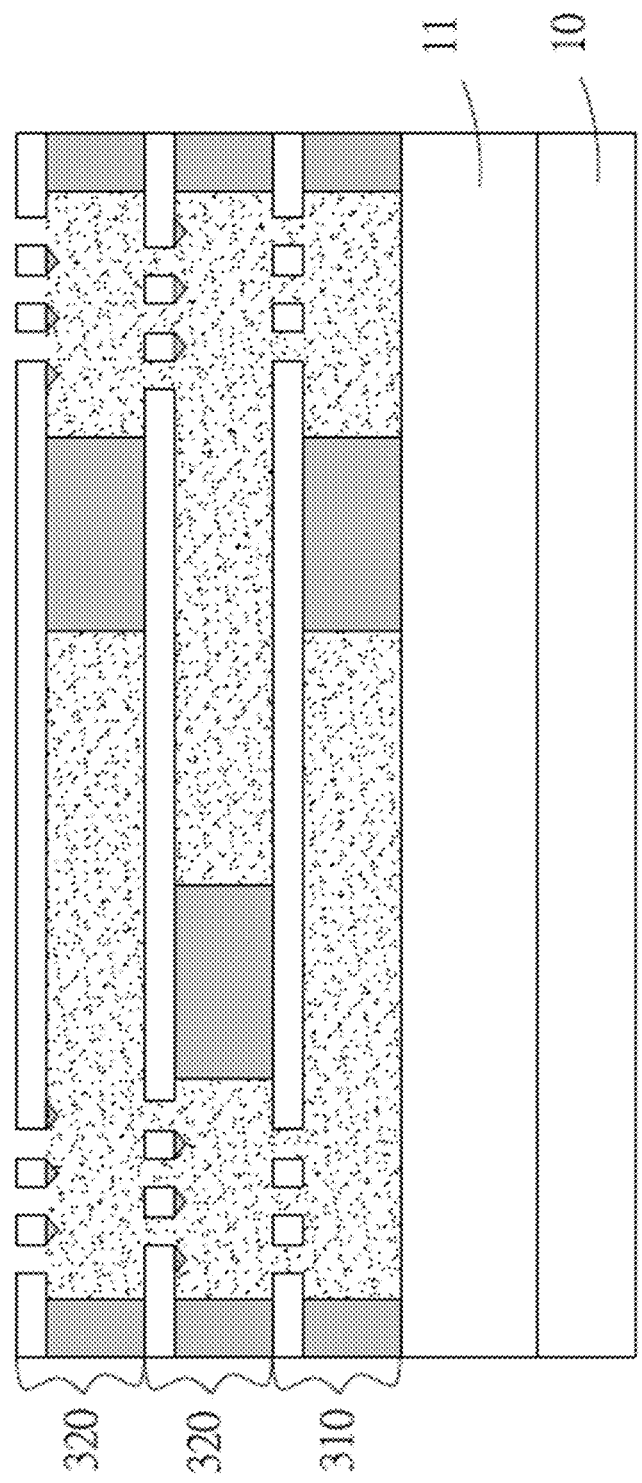
Figures 3, 4, 5, 6, 7, 8, 9, 10, 11, 12, 13, 14, 15:
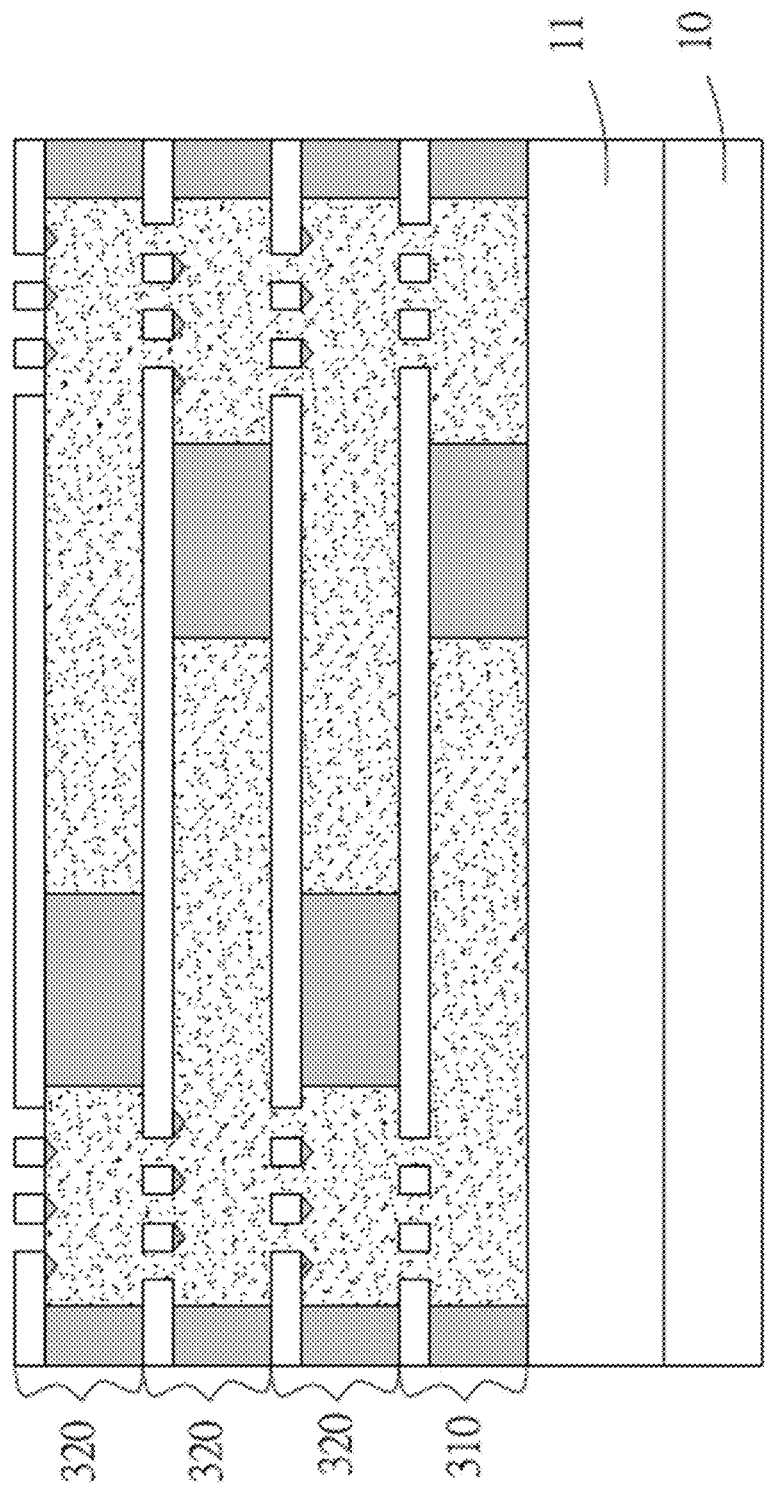
Figures 3, 4, 5, 6, 7, 8, 9, 10, 11, 12, 13, 14, 15, 16:
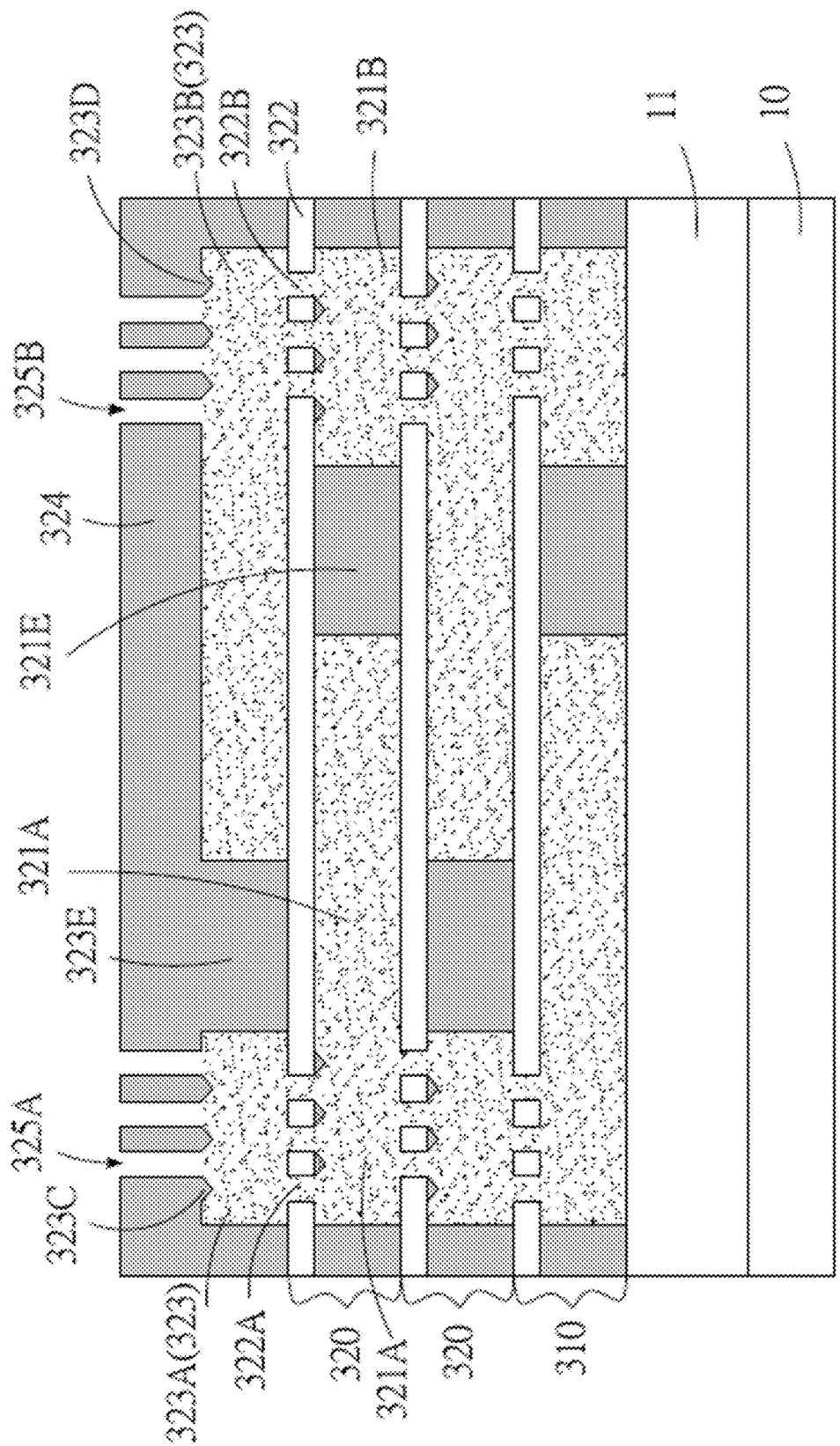
Figures 3, 4, 5, 6, 7, 8, 9, 10, 11, 12, 13, 14, 15, 16, 17:
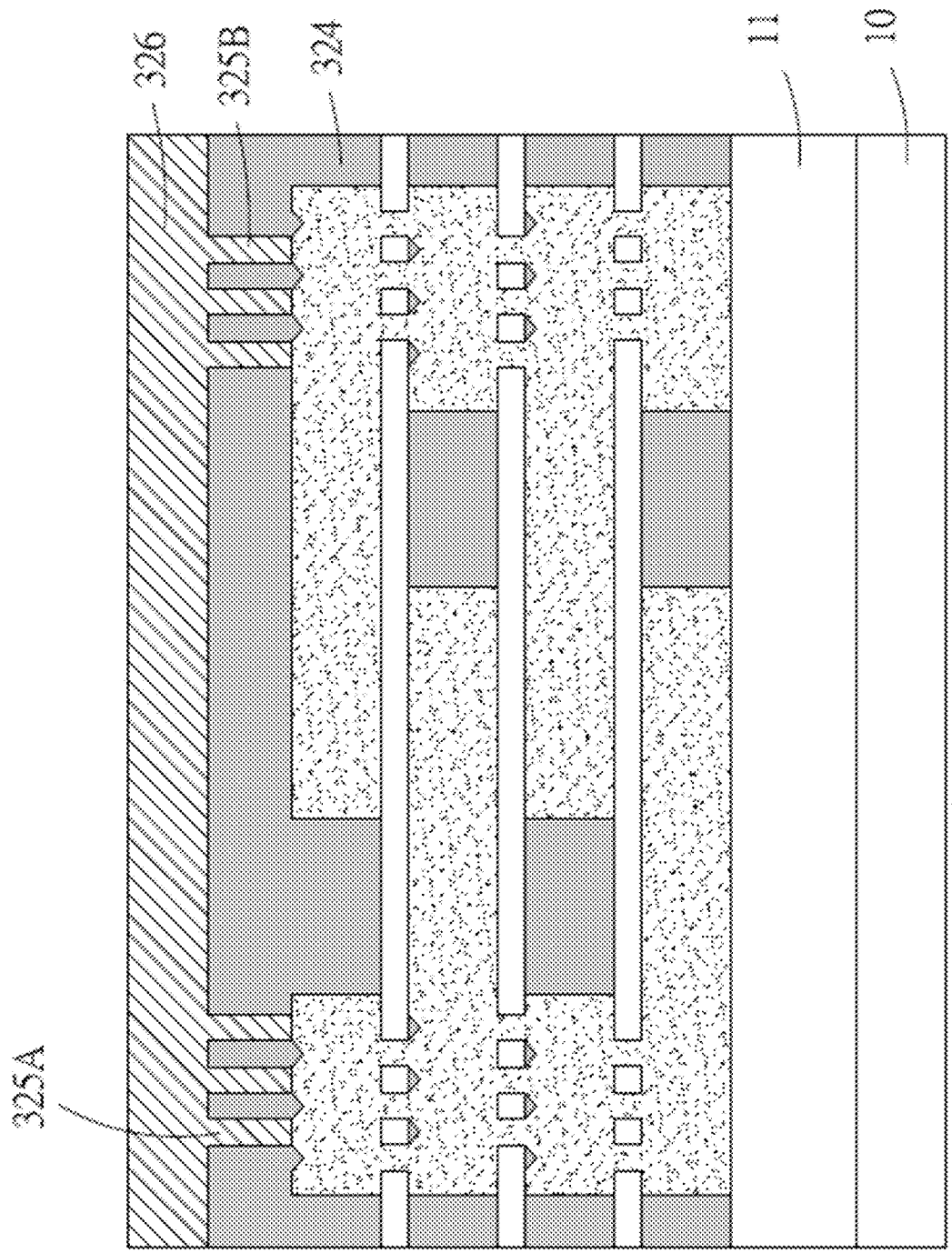
Figures 3, 4, 5, 6, 7, 8, 9, 10, 11, 12, 13, 14, 15, 16, 17, 18:
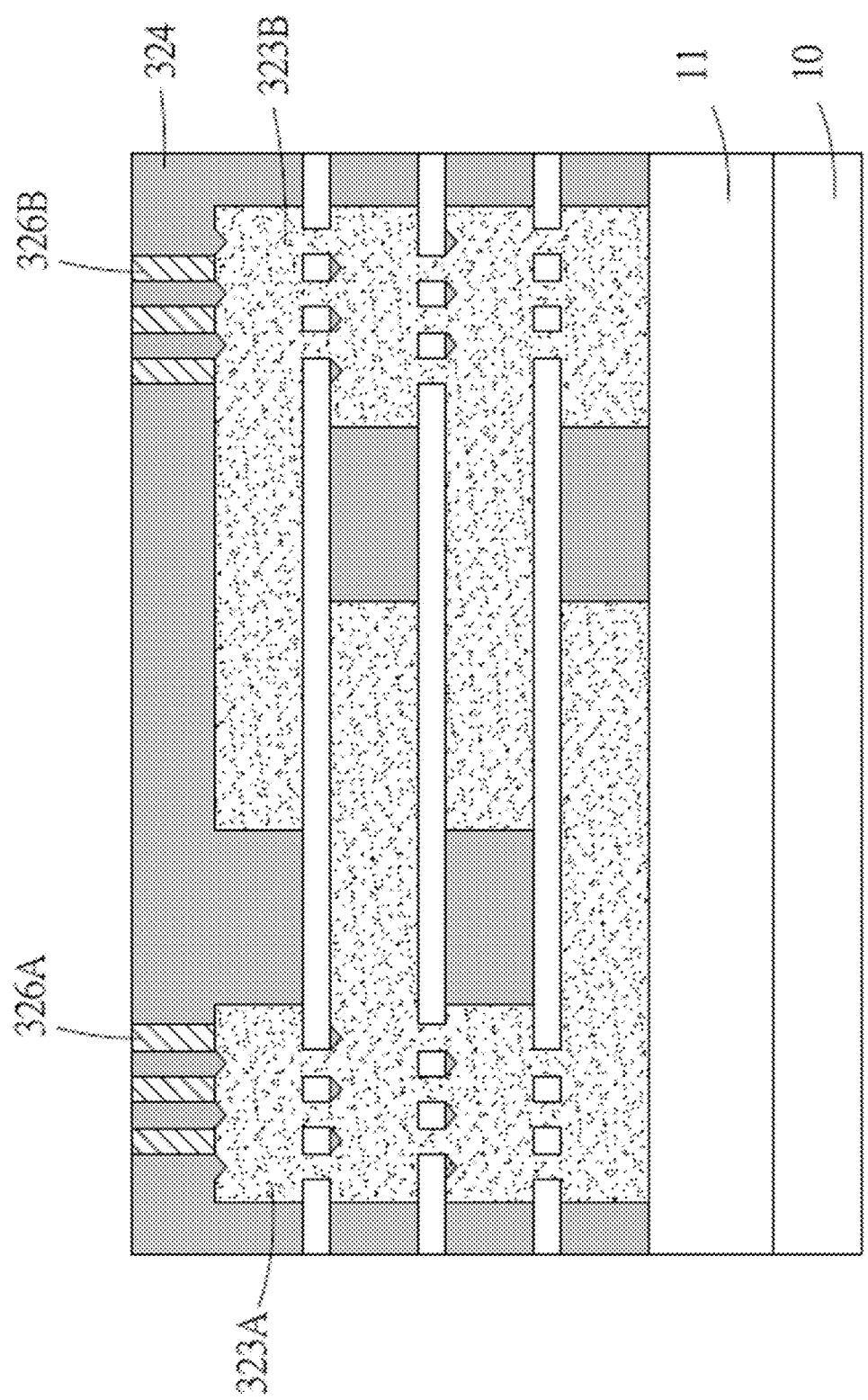
Figures 3, 4, 5, 6, 7, 8, 9, 10, 11, 12, 13, 14, 15, 16, 17, 18, 19:
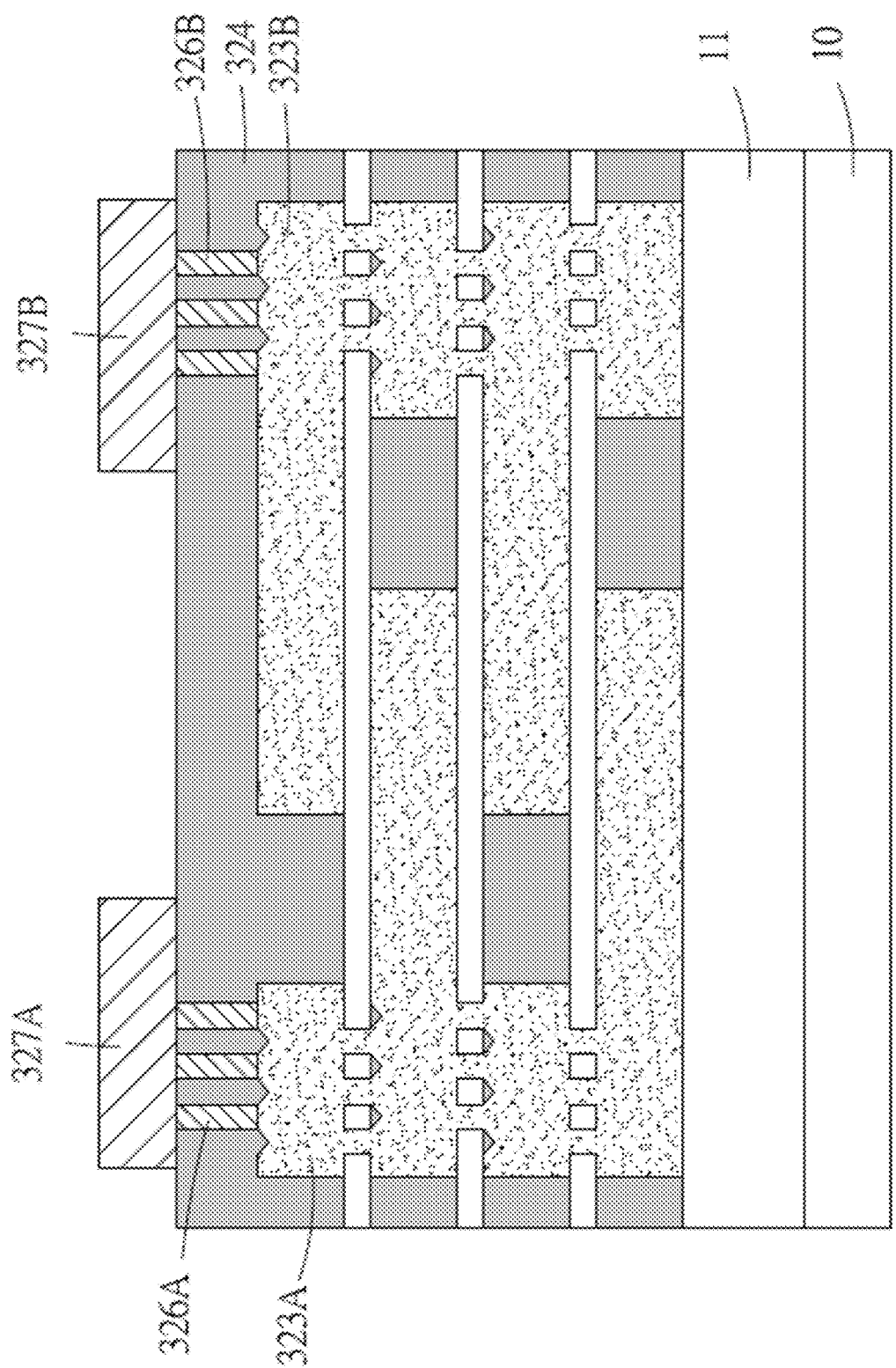
Figures 3, 4, 5, 6, 7, 8, 9, 10, 11, 12, 13, 14, 15, 16, 17, 18, 19, 20:
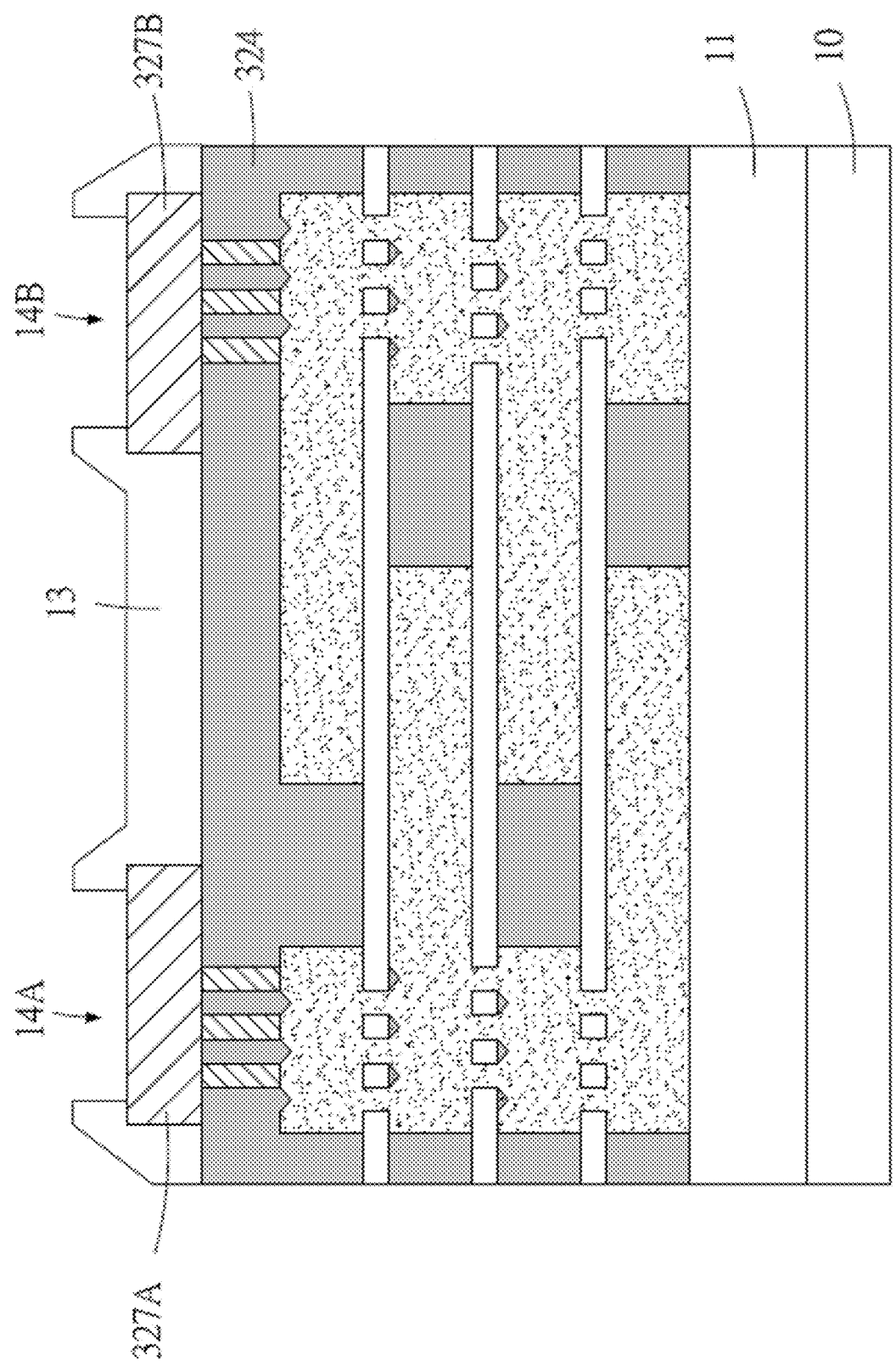

As shown in FIG. 3-5, the first interlayer dielectric layer 3115 is formed to cover the first left electrode 311A and the first right electrode 311B, and the first trench 311C is filled with the first interlayer dielectric layer 3115. In the present embodiment, the first interlayer dielectric layer 3115 is formed, for example, by deposition.

As shown in FIG. 3-6, a planarization process is performed, so that the upper surface of the first interlayer dielectric layer 3115 is flush with the upper surface of the first conductive layer 311 (i.e., the first left electrode 311A and the first right electrode 311B). In the present embodiment, the planarization process includes a chemical mechanical polishing (CMP) process or an etch back process.

As shown in FIG. 3-7, the first capacitor dielectric layer 312 is formed to cover the first interlayer dielectric layer 3115 and the first conductive layer 311 (i.e., the first left electrode 311A and the first right electrode 311B). In the present embodiment, the first capacitor dielectric layer 312 is deposited, for example, by a chemical vapor deposition (CVD) process.

As shown in FIG. 3-8, the first capacitor dielectric layer 312 is lithographically etched to form the first left openings 312A exposing the first left electrode 311A and the first right openings 312B exposing the first right electrode 311B. Furthermore, the first left openings 312A and the first right openings 312B will be filled with a conductive material in a subsequent process to form a conductive path between different conductive layers (please refer to the detailed description below). So far, the process of forming the first capacitor dielectric structure 310 on the isolation layer 11 is completed.

Then, at least one second capacitor dielectric structure 320 is formed on the first capacitor dielectric structure 310 (as shown in FIG. 3-9 to FIG. 3-15). In the present embodiment, the second capacitor dielectric structure 320 includes the second conductive layer 321 formed on the first capacitor dielectric layer 312 and the second capacitor dielectric layer 322 formed on the second conductive layer 321. The second conductive layer 321 includes the second left electrode 321A and the second right electrode 321B isolated from each other. The second left electrode 321A is electrically connected to the first left electrode 311A through the first left openings 312A. The second right electrode 321B is electrically connected to the first right electrode 311B through the first right openings 312B. The second capacitor dielectric layer 322 includes second left openings 322A formed above the second left electrode 321A and second right openings 322B formed above the second right electrode 321B. The second left openings 322A and the first left openings 312A are offset from each other, and the second right openings 322B and the first right openings 312B are offset from each other.

Specifically, as shown in FIG. 3-9, the second conductive layer 321 is formed on the first capacitor dielectric layer 312, and the first left opening 312A and the first right opening 312B are filled with the second conductive layer 321. In the present embodiment, the second conductive layer 321 is formed, for example, by sputtering. The second left recesses 321C and second right recesses 321D are correspondingly formed on the upper surface of the second conductive layer 321 located above the first left openings 312A and the first right openings 312B.

Next, the photoresist layer (not shown) is formed on the second conductive layer 321, and the photoresist layer and the second conductive layer 321 are lithographically etched to form the second trench 321E, so that the second left electrode 321A and the second right electrode 312B isolated by the second trench 321E are formed in the second conductive layer 321, and then the photoresist layer above the second left electrode 321A and the second right electrode 321B is removed. As shown in FIG. 3-10, the forming position of the second trench 321E in the second conductive layer 321 is offset from the forming position of the first trench 311C in the first conductive layer 311. The second left electrode 321A is electrically connected to the first left electrode 311A through the first left openings 312A, and the second right electrode 321B is electrically connected to the first right electrode 311B through the first right openings 312B.

As shown in FIG. 3-11, the second interlayer dielectric layer 3215 is formed to cover the second left electrode 321A and the second right electrode 321B, and the second trench 321E is filled with the second interlayer dielectric layer 3215. In the present embodiment, the second interlayer dielectric layer 3215 is formed, for example, by deposition. Then, as shown in FIG. 3-12, a planarization process is performed, so that the upper surface of the second interlayer dielectric layer 3215 is flush with the upper surface of the second conductive layer 321 (i.e., the second left electrode 321A and the second right electrode 321B). In the present embodiment, the planarization process includes a chemical mechanical polishing (CMP) process or an etch back process.

As shown in FIG. 3-13, the second capacitor dielectric layer 322 is formed to cover the second interlayer dielectric layer 3215 (i.e., the second trench 321E) and the second conductive layer 321 (i.e., the second left electrode 321A and the second right electrode 321B). The second capacitor dielectric layer 322 is lithographically etched to form the second left openings 322A exposing the second left electrode 321A and the second right openings 322B exposing the second right electrode 321B. The second left openings 322A are offset from the first left openings 312A. The second right openings 322B are offset from the first right openings 312B. Furthermore, the second left openings 322A and the second right openings 322B will be filled with a conductive material in a subsequent process to form a conductive path between different conductive layers. So far, the process of forming the second capacitor dielectric structure 320 on the first capacitor dielectric structure 310 is completed.

In addition, a plurality of the second capacitor dielectric structures 320 may be formed on the first capacitor dielectric structure 310. FIGS. 3-14 to 3-15 illustrate a process for forming a plurality of the second capacitor dielectric structures 320 on the first capacitor dielectric structure 310.

Referring to FIG. 3-16, the third conductive layer 323 is formed on the second capacitor dielectric structure 320. The third conductive layer 323 includes the third left electrode 323A and the third right electrode 323B isolated from each other. The third left electrode 323A is electrically connected to the second left electrode 321A through the second left openings 322A, and the third right electrode 323B is electrically connected to the second right electrode 321B through the second right openings 322B. Then, the third interlayer dielectric layer 324 is formed to cover the third conductive layer 323.

Specifically, first, the third conductive layer 323 is formed on the second capacitor dielectric layer 322, and the second left opening 322A and the second right opening 322B are filled with the third conductive layer 323, so that the third left recesses 323C located above the second left openings 322A and the third right recesses 323D located above the second right openings 322B are formed on the upper surface of the third conductive layer 323.

Then, the third conductive layer 323 is etched to form the third trench 323E in the third conductive layer 323 and form the third left electrode 323A and the third right electrode 323B isolated by the third trench 323E. The third trench 323E is offset from the second trench 321E. The third left electrode 323A is electrically connected to the second left electrode 321A through the second left openings 322A, and the third right electrode 323B is electrically connected to the second right electrode 321B through the second right openings 322B. Next, the third interlayer dielectric layer 324 is formed on the third conductive layer 323, and the third trench 323E is filled with the third interlayer dielectric layer 324.

Then, the third interlayer dielectric layer 324 is etched to form the first via holes 325A and the second via holes 325B. Each of the first via holes 325A exposes the upper surface of the third left electrode 323A, and each of the second via holes 325B exposes the upper surface of the third right electrode 323B.

As shown in FIG. 3-17, for example, a CVD process is performed to form the metal material 326 above the third interlayer dielectric layer 324, and the first via holes 325A and the second via holes 325B are filled with the metal material 326. Generally, the metal material 326 formed in the first via holes 325A and the second via holes 325B is mainly tungsten, and the metal material 326 may include a layer of titanium nitride/titanium composite material as an adhesive layer (not shown). The adhesive layer is typically formed by physical vapor deposition (PVD), so the metal material 326 may be composed of a composite material.

As shown in FIG. 3-18, for example, a chemical mechanical polishing (CMP) or etch back process is performed to planarize the upper surface of the third interlayer dielectric layer 324, thereby forming the first metal pillars 326A and the second metal pillars 326B.

As shown in FIG. 3-19, the first bonding pad 327A is formed over the first metal pillars 326A, and the second bonding pad 327B is formed over the second metal pillars 326B. The first bonding pad 327A is electrically connected to the third left electrode 323A by the first metal pillars 326A, and the second bonding pad 327B is electrically connected to the third right electrode 323B by the second metal pillars 326B.

As shown in FIG. 3-20, the protection layer 13 is formed to respectively cover the first bonding pad 327A, the second bonding pad 327B, and the exposed third interlayer dielectric layer 324. In the present embodiment, the protection layer 13 may be formed by deposition. Next, the protective layer 13 is lithographically etched to form the first bonding pad opening 14A exposing the first bonding pad 327A and the second bonding pad opening 14B exposing the second bonding pad 327B.

In addition, it should be noted that one or more second capacitor dielectric structures 320 may be formed according to actual needs in the present embodiment. However, the steps of forming the second capacitor structure 320 of FIG. 3-9 to FIG. 3-15 may also be omitted. That is, after the manufacture process of FIG. 3-8 is performed, the manufacture process step of FIG. 3-16 is directly performed. In other words, the third conductive layer 323 is formed on the first capacitor dielectric structure 310.

In summary, the manufacturing method of the capacitor unit and the capacitor unit structure of the invention forms the capacitor stacked structures on the substrate by the isolation layer to form the capacitor integrated structure including the capacitor units. Therefore, the capacitor integrated structure can be cut to form a plurality of the capacitor units that can function as capacitors. Thereby, the capacitor manufacturing process and the capacitor structure can be simplified, and the high-temperature calcination process in the manufacturing process of the traditional MLCC can be avoided, so as to achieve the purpose of reducing the manufacturing cost.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a capacitor unit, comprising:
providing a substrate;
forming an isolation layer on the substrate;
forming a first capacitor stacked structure and a second capacitor stacked structure on the isolation layer, wherein the first capacitor stacked structure and the second capacitor stacked structure adjacent to each other share no electrode;
forming electrode connectors on the first capacitor stacked structure and the second capacitor stacked structure, wherein the electrode connectors are exposed, so that the electrode connectors, the first capacitor stacked structure, the second capacitor stacked structure, the isolation layer, and the substrate are combined to form a capacitor integrated structure, wherein the isolation layer electrically isolates the substrate from the first capacitor stacked structure and the second capacitor stacked structure; and
cutting the capacitor integrated structure to form a first capacitor unit and a second capacitor unit separated from each other, wherein the first capacitor unit comprises two of the electrode connectors, the first capacitor stacked structure, a portion of the isolation layer, and a portion of the substrate, and the second capacitor unit comprises another two of the electrode connectors, the second capacitor stacked structure, another portion of the isolation layer, and another portion of the substrate.

2. The method of manufacturing the capacitor unit according to claim 1, wherein the step of forming the first capacitor stacked structure and the second capacitor stacked structure comprises:
forming a first conductive layer on the isolation layer;
forming a capacitor dielectric layer on the first conductive layer;
forming a second conductive layer on the capacitor dielectric layer;
lithographically etching the second conductive layer, the capacitor dielectric layer, and the first conductive layer thereunder in sequence to expose a first portion of the capacitor dielectric layer and a first portion of the isolation layer;
forming an interlayer dielectric layer to cover the second conductive layer, the first portion of the capacitor dielectric layer, and the first portion of the isolation layer;
etching the interlayer dielectric layer to form first via holes and second via holes, wherein each of the first via holes passes through the first portion of the capacitor dielectric layer to expose the first conductive layer under the first portion of the capacitor dielectric layer, and each of the second via holes exposes the second conductive layer;
respectively filling the first via holes and the second via holes with a metal material to form first metal pillars and second metal pillars; and
forming a first bonding pad over the first metal pillars, and forming a second bonding pad over the second metal pillars, wherein the first bonding pad is electrically connected to the first conductive layer by the first metal pillars to form a first electrode, and the second bonding pad is electrically connected to the second conductive layer by the second metal pillars to form a second electrode.

3. The method of manufacturing the capacitor unit according to claim 2, wherein the step of respectively filling the first via holes and the second via holes with the metal material to form first metal pillars and second metal pillars comprises:
depositing the metal material on the interlayer dielectric layer, wherein the first via holes and the second via holes are filled with the metal material; and
performing a planarization process to planarize an upper surface of the interlayer dielectric layer.

4. The method of manufacturing the capacitor unit according to claim 2, further comprising:
forming a protection layer to respectively cover the first bonding pad, the second bonding pad, and the interlayer dielectric layer; and
lithographically etching the protection layer to respectively form a first bonding pad opening exposing the first bonding pad and a second bonding pad opening exposing the second bonding pad.

5. The method of manufacturing the capacitor unit according to claim 1, wherein the step of forming the first capacitor stacked structure and the second capacitor stacked structure comprises:
forming a first conductive layer on the isolation layer;
lithographically etching the first conductive layer to expose a first portion of isolation layer;
forming two spacers connected to two sidewalls of the first conductive layer;
forming a capacitor dielectric layer covering the first conductive layer and the first portion of the isolation layer, wherein the capacitor dielectric layer comprises a third portion directly formed above the first portion of the isolation layer, and the capacitor dielectric layer and the sidewalls of the first conductive layer are isolated by the two spacers;
forming a second conductive layer on a portion of the capacitor dielectric layer and exposing a fourth portion of the capacitor dielectric layer above the first conductive layer;
forming an interlayer dielectric layer to cover the second conductive layer and the fourth portion of the capacitor dielectric layer;
etching the interlayer dielectric layer to form first via holes and second via holes, wherein each of the first via holes passes through the fourth portion of the capacitor dielectric layer to expose the first conductive layer under the fourth portion, and each of the second via holes is disposed above the third portion of the capacitor dielectric layer to expose the second conductive layer above the third portion;
respectively filling the first via holes and the second via holes with a metal material to form first metal pillars and second metal pillars;
forming a bonding pad metal layer to respectively cover the interlayer dielectric layer, the first metal pillars, and the second metal pillars; and
etching the bonding pad metal layer to form a first bonding pad over the first metal pillars and form a second bonding pad above the second metal pillars, wherein the first bonding pad is electrically connected to the first conductive layer by the first metal pillars to form a first electrode, and the second bonding pad is electrically connected to the second conductive layer by the second metal pillars to form a second electrode.

6. The method of manufacturing the capacitor unit according to claim 1, wherein the step of forming the first capacitor stacked structure and the second capacitor stacked structure comprises:
   forming a first capacitor dielectric structure on the isolation layer, wherein the first capacitor dielectric structure comprises a first conductive layer formed on the isolation layer and a first capacitor dielectric layer formed on the first conductive layer, the first conductive layer comprises a first left electrode and a first right electrode isolated from each other, and the first capacitor dielectric layer comprises first left openings formed above the first left electrode and first right openings formed above the first right electrode;
   forming at least one second capacitor dielectric structure on the first capacitor dielectric structure, wherein the at least one second capacitor dielectric structure comprises a second conductive layer formed on the first capacitor dielectric layer and a second capacitor dielectric layer formed on the second conductive layer, the second conductive layer comprises a second left electrode and a second right electrode isolated from each other, the second left electrode is electrically connected to the first left electrode through the first left openings, the second right electrode is electrically connected to the first right electrode through the first right openings, the second capacitor dielectric layer comprises second left openings formed above the second left electrode and second right openings formed above the second right electrode, the second left openings and the first left openings are offset from each other, and the second right openings and the first right openings are offset from each other;
   forming a third conductive layer on the at least one second capacitor dielectric structure, wherein the third conductive layer comprises a third left electrode and a third right electrode isolated from each other, the third left electrode is electrically connected to the second left electrode through the second left openings, and the third right electrode is electrically connected to the second right electrode through the second right openings;
   forming a third interlayer dielectric layer to cover the third conductive layer, and planarizing a surface of the third interlayer dielectric layer;
   etching the third interlayer dielectric layer to form first via holes and second via holes, wherein each of the first via holes exposes an upper surface of the third left electrode, and each of the second via holes exposes an upper surface of the third right electrode;
   respectively filling the first via holes and the second via holes with a metal material to form first metal pillars and second metal pillars; and
   forming a first bonding pad over the first metal pillars, and forming a second bonding pad over the second metal pillars, wherein the first bonding pad is electrically connected to the third left electrode by the first metal pillars, and the second bonding pad is electrically connected to the third right electrode by the second metal pillars.

7. The method of manufacturing the capacitor unit according to claim 6, wherein the step of forming the first capacitor dielectric structure comprises:
   forming the first conductive layer on the isolation layer;
   forming a photoresist layer on the first conductive layer;
   lithographically etching the photoresist layer and the first conductive layer to form a first trench, so that the first left electrode and the first right electrode isolated by the first trench are formed in the first conductive layer;
   removing the photoresist layer above the first left electrode and layer the first right electrode;
   filling the first trench with a first interlayer dielectric layer, and making an upper surface of the first interlayer dielectric layer flush with an upper surface of the first conductive layer;
   forming the first capacitor dielectric layer covering the first interlayer dielectric layer and the first conductive layer; and
   lithographically etching the first capacitor dielectric layer to form the first left openings exposing the first left electrode and the first right openings exposing the first right electrode.

8. The method of manufacturing the capacitor unit according to claim 7, wherein the step of forming the at least one second capacitor dielectric structure comprises:
   forming the second conductive layer on the first capacitor dielectric layer, wherein the first left openings and the first right openings are filled with the second conductive layer;
   lithographically etching the second conductive layer to form a second trench, so that the second left electrode and the second right electrode isolated by the second trench are formed in the second conductive layer, wherein the second trench is offset from the first trench, the second left electrode is electrically connected to the first left electrode through the first left openings, and the second right electrode is electrically connected to the first right electrode through the first right openings;
   forming a second interlayer dielectric layer on the second conductive layer, filling the second trench with the second interlayer dielectric layer, and making an upper surface of the second interlayer dielectric layer in the second trench flush with an upper surface of the second conductive layer;
   forming the second capacitor dielectric layer covering the second interlayer dielectric layer and the second conductive layer; and
   lithographically etching the second capacitor dielectric layer to form the second left openings exposing the second left electrode and the second right openings exposing the second right electrode, wherein the second left openings are offset from the first left openings, and the second right openings are offset from the first right openings.

9. The method of manufacturing the capacitor unit according to claim 8, further comprising:
   forming the third conductive layer on the second capacitor dielectric layer, wherein the second left openings and the second right openings are filled with the third conductive layer;
   lithographically etching the third conductive layer to form a third trench, so that the third left electrode and the third right electrode isolated by the third trench are formed in the third conductive layer, wherein the third trench is offset from the second trench, the third left electrode is electrically connected to the second left electrode through the second left openings, and the third right electrode is electrically connected to the second right electrode through the second right openings; and forming the third interlayer dielectric layer on the third conductive layer, wherein the third trench is filled with the third interlayer dielectric layer.

10. The method of manufacturing the capacitor unit according to claim 1, wherein the step of forming the first capacitor stacked structure and the second capacitor stacked structure comprises:

forming a first capacitor dielectric structure on the isolation layer, wherein the first capacitor dielectric structure comprises a first conductive layer formed on the isolation layer and a first capacitor dielectric layer formed on the first conductive layer, the first conductive layer comprises a first left electrode and a first right electrode isolated from each other, and the first capacitor dielectric layer comprises first left openings formed above the first left electrode and first right openings formed above the first right electrode;

forming a third conductive layer on the first capacitor dielectric structure, wherein the third conductive layer comprises a third left electrode and a third right electrode isolated from each other, the third left electrode is electrically connected to the first left electrode through the first left openings, and the third right electrode is electrically connected to the first right electrode through the first right openings;

forming a third interlayer dielectric layer to cover the third conductive layer;

lithographically etching the third interlayer dielectric layer to form first via holes and second via holes, wherein each of the first via holes exposes an upper surface of a portion the third left electrode, and each of the second via holes exposes an upper surface of a portion of the third right electrode;

respectively filling the first via holes and the second via holes with a metal material to form first metal pillars and second metal pillars; and forming a first bonding pad over the first metal pillars, and forming a second bonding pad over the second metal pillars, wherein the first bonding pad is electrically connected to the third left electrode by the first metal pillars, and the second bonding pad is electrically connected to the third right electrode by the second metal pillars.

\* \* \* \* \*